United States Patent
Weng et al.

(10) Patent No.: US 10,141,948 B2
(45) Date of Patent: Nov. 27, 2018

(54) DELTA-SIGMA MODULATOR, ANALOG-TO-DIGITAL CONVERTER AND ASSOCIATED SIGNAL CONVERSION METHOD BASED ON MULTI STAGE NOISE SHAPING STRUCTURE

(71) Applicant: MEDIATEK Inc., Hsin-Chu (TW)

(72) Inventors: Chan-Hsiang Weng, Kaohsiung (TW); Tien-Yu Lo, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/586,332

(22) Filed: May 4, 2017

(65) Prior Publication Data
US 2017/0353191 A1 Dec. 7, 2017

Related U.S. Application Data

(60) Provisional application No. 62/346,523, filed on Jun. 6, 2016.

(51) Int. Cl.
*H03M 3/00* (2006.01)

(52) U.S. Cl.
CPC .......... *H03M 3/326* (2013.01); *H03M 3/368* (2013.01); *H03M 3/414* (2013.01); *H03M 3/458* (2013.01)

(58) Field of Classification Search
CPC ........ H03M 3/43; H03M 3/436; H03M 3/414; H03M 3/454; H03M 3/468; H03M 3/45; H03M 3/30; H03M 3/438
USPC ........................................................ 341/143
See application file for complete search history.

(56) References Cited

U.S. PATENT DOCUMENTS

| | | | |
|---|---|---|---|
| 5,936,562 A | 8/1999 | Brooks et al. | |
| 5,959,562 A * | 9/1999 | Wiesbauer | H03M 3/38 341/143 |
| 6,373,417 B1 * | 4/2002 | Melanson | H03M 3/506 341/143 |
| 6,407,689 B1 * | 6/2002 | Bazarjani | H03M 3/32 341/132 |
| 7,432,841 B1 * | 10/2008 | Kinyua | H03M 3/414 341/143 |

(Continued)

OTHER PUBLICATIONS

EPO Search Report dated Nov. 10, 2017 in EP application (No. 17173703.4-1805).

*Primary Examiner* — Linh Nguyen
(74) *Attorney, Agent, or Firm* — Wolf, Greenfield & Sacks, P.C.

(57) ABSTRACT

To convert a first stage input to a digital output, a delta-sigma modulator, an analog-to-digital converter and an associated signal conversion method based on an MASH structure are provided. The analog-to-digital converter includes the delta-sigma modulator and a sample and hold circuit. The delta-sigma modulator includes a first signal converter, a second signal converter and a digital cancellation logic. The first signal converter converts the first stage input to a first converted output. The first signal converter shapes a first stage quantization error to generate a second stage input. The first stage input and the second stage input are analog signals. The second signal converter converts the second stage input to a second converted output. The digital cancellation logic generates a digital output according to the first converted output and the second converted output.

5 Claims, 15 Drawing Sheets

(56) References Cited

U.S. PATENT DOCUMENTS

| | | | |
|---|---|---|---|
| 2004/0174285 A1* | 9/2004 | Radja | H03M 3/402 |
| | | | 341/143 |
| 2005/0275571 A1 | 12/2005 | Bjornsen | |
| 2005/0275577 A1* | 12/2005 | Bjornsen | H03M 3/46 |
| | | | 341/155 |
| 2006/0022854 A1* | 2/2006 | Bjornsen | H03M 1/0641 |
| | | | 341/120 |
| 2008/0136693 A1* | 6/2008 | Kim | H03M 3/374 |
| | | | 341/143 |
| 2008/0150776 A1* | 6/2008 | DiGiandomenico | |
| | | | H03M 7/3022 |
| | | | 341/143 |
| 2008/0180293 A1* | 7/2008 | Kitahira | H03M 3/358 |
| | | | 341/144 |
| 2009/0021409 A1* | 1/2009 | Mathe | H03M 3/374 |
| | | | 341/143 |
| 2009/0128384 A1* | 5/2009 | Di Giandomenico | |
| | | | H03M 3/398 |
| | | | 341/143 |
| 2014/0368368 A1* | 12/2014 | Koli | H03M 3/462 |
| | | | 341/143 |
| 2015/0288379 A1* | 10/2015 | Silva | H03M 3/352 |
| | | | 341/118 |

* cited by examiner

US 10,141,948 B2

DELTA-SIGMA MODULATOR, ANALOG-TO-DIGITAL CONVERTER AND ASSOCIATED SIGNAL CONVERSION METHOD BASED ON MULTI STAGE NOISE SHAPING STRUCTURE

This application claims the benefit of U.S. provisional application Ser. No. 62/346,523, filed Jun. 6, 2016, the disclosure of which is incorporated by reference herein in its entirety.

TECHNICAL FIELD

The disclosure relates in general to a delta-sigma modulator ($\Delta\Sigma$-modulator), an analog-to-digital converter (ADC) and an associated signal conversion method, and more particularly to a delta-sigma modulator, an analog-to-digital converter and an associated signal conversion method based on a multi stage noise shaping (MASH) structure.

BACKGROUND

Although most environmental signals are analog signals, digital signal processing (hereinafter, DSP) has many advantages such as, more precise and more flexible, and DSP design has become the mainstream of electronics systems. Therefore, in many electronics applications, analog signals are converted into digital signals, and the analog-to-digital converters (hereinafter, ADC) are essential components nowadays.

The precision of a DSP system, especially a communication system, is dominated by the resolution of its digital input signal and precision of ADC is important. Delta-sigma (hereinafter, $\Delta\Sigma$) ADCs have become more and more popular in high-resolution ADCs due to its characteristics such as high resolution, high stability, low power and low cost.

A $\Delta\Sigma$-modulator is the most important component in the $\Delta\Sigma$-ADC and a quantization process performed in the $\Delta\Sigma$-modulator introduces a quantization error. The quantization error is an inherent but undesirable factor of the $\Delta\Sigma$-ADC. Therefore, suppressing side effects caused by the quantization error is especially attractive for high speed applications.

SUMMARY

The disclosure relates to a delta-sigma modulator, an analog-to-digital converter and an associated signal conversion method based on an MASH structure. By shaping a quantization error between different stages, the delta-sigma modulator, the analog-to-digital converter and the signal conversion method are capable of reducing the side effects caused by mismatch design.

According to one embodiment, a delta-sigma modulator for digitizing a first stage input is provided. The delta-sigma modulator includes a first signal converter, a second signal converter and a digital cancellation logic. The first signal converter converts the first stage input to a first converted output and shapes a first stage quantization error to generate a second stage input. The first stage input and the second stage input are analog signals. The second signal converter converts the second stage input to a second converted output. The digital cancellation logic is coupled to the first signal converter and the second signal converter. The digital cancellation logic generates a digital output according to the first converted output and the second converted output.

According to another embodiment, an analog-to-digital converter for converting a first stage input to a digital output is provided. The analog-to-digital converter includes a delta-sigma modulator, and the delta-sigma modulator includes a first signal converter, a second signal converter, and a digital cancellation logic. The first signal converter converts the first stage input to a first converted output and shapes a first stage quantization error to generate a second stage input. The first stage input and the second stage input are analog signals. The second signal converter converts the second stage input to a second converted output. The digital cancellation logic is coupled to the first signal converter and the second signal converter. The digital cancellation logic generates the digital output according to the first converted output and the second converted output.

According to still another embodiment, a signal conversion method applied to a delta-sigma modulator for digitizing a first stage input is provided. The signal conversion method includes flowing steps. The first stage input is converted to a first converted output. A first stage quantization error is shaped to generate a second stage input. The first stage input and the second stage input are analog signals. The second stage input is converted to a second converted output. A digital output is generated according to the first converted output and the second converted output.

Figure 1:
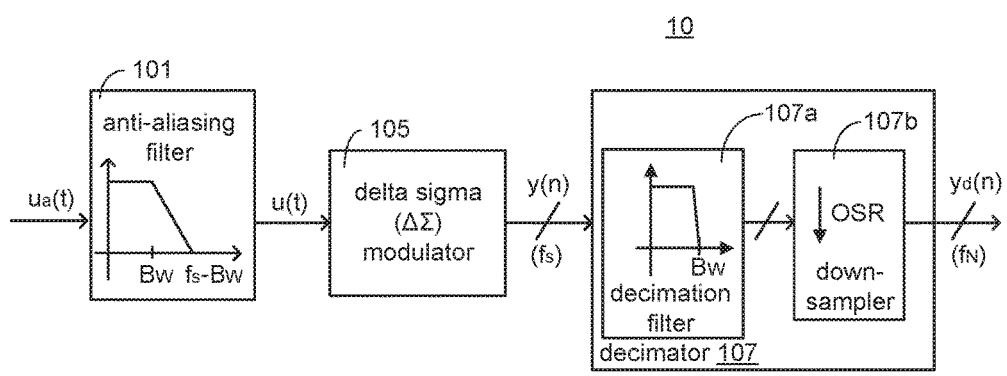
FIG. 1 is a schematic diagram illustrating a block diagram of a $\Delta\Sigma$-ADC according to the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 is a schematic diagram illustrating a block diagram of a ΔΣ-ADC according to the present disclosure. The ΔΣ-ADC 10 includes a ΔΣ-modulator 105 and a decimator 107 for sample reduction, and the decimator 107 is coupled to the ΔΣ-modulator 105. The decimator 107 may include a decimation filter 107a and a down-sampler 107b. In some applications, the ΔΣ-ADC may further include an anti-aliasing filter (hereinafter, AAF) 101 coupled to the ΔΣ-modulator 105. The AAF 101 band limits the analog signal and avoids aliasing during sampling.

First, an analog raw input $u_a(t)$ of the ΔΣ-ADC 10 passes through the AAF 101. An anti-aliased signal u(t) being outputted by the AAF 101 is sent to the ΔΣ-modulator 105.

After modulating the anti-aliasing signal u(t), the ΔΣ-modulator 105 outputs a digital output signal y(n) to the decimator 107, and the decimator 107 generates a digital code $y_d(n)$ based on the digital output y(n). In the decimator 107, the decimation filter 107a removes the out-of-band spectral content of the digital output y(n), and the down-sampler 107b reduces the data rate from the sampling rate (fs) down to Nyquist frequency ($f_N$) according to the over-sampling ratio (hereinafter, CSR).

Figure 2A:
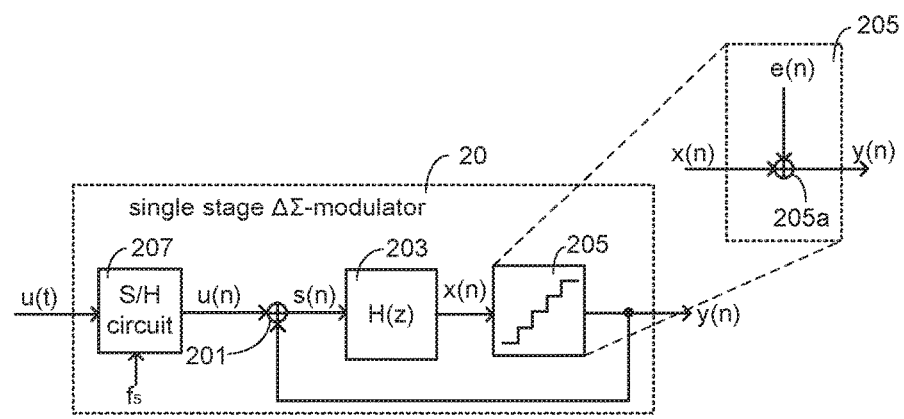
FIG. 2A is a schematic diagram illustrating an overall structure of a single stage $\Delta\Sigma$-modulator from the perspective of continuous time.

FIG. 2A is a schematic diagram illustrating an overall structure of a single stage ΔΣ-modulator from the perspective of continuous time. The single stage ΔΣ-modulator 20 includes a sample and hold (S/H) circuit 207, a loop filter 203, a quantizer 205, and a summer 201. The loop filter 203 is a discrete time loop filter, whose transfer function is represented as H(z).

After receiving an input signal u(t), the S/H circuit 207 samples and holds the input signal u(t) and accordingly transforms the input signal u(t) into an analog signal u(n). Then, the analog signal u(n) is transmitted to the summer 201 and the single stage ΔΣ-modulator 20 further digitizes the analog signal u(n) and outputs a digital output y(n).

In the single stage ΔΣ-modulator 20, an output of the summer 201 can be considered as a delta signal s(n), and an output of the loop filter 203, can be considered as a sigma signal x(n). In FIG. 2A, the summer 201 subtracts the digital output y(n) from the analog signal u(n) to obtain the delta signal s(n). The loop filter 203 receives and filters the delta signal s(n) to generate the sigma signal x(n). The quantizer 205 quantizes the sigma signal x(n) and generates the digital output y(n). The flow is recursively executed because of the feedback (loop) based design.

In the present disclosure, summers may perform a summation operation or a subtraction operation. It should be noted that, whether the summation operation or the subtraction operation is performed by the summers is varied with phase of the signal. The summation operation implies that a first signal and a second signal are directly summed up to generate a third signal. The subtraction operation implies that the first signal is firstly inversed, and the inversed first signal is summed with the second signal to generate the third signal. The following descriptions regarding the summation/subtraction operation of the summers are for illustration, not limitation.

The upper-right corner of FIG. 2A represents a linear model of the quantizer 205. Basically, the quantizer 205 can be considered as a summer 205a whose two inputs are respectively from the output of the loop filter 203 and a quantization error (quantization noise) e(n). The quantization error e(n) is inherent in quantization operation of the quantizer 205. Generally, the quantization error e(n) of the quantizer 205 is assumed to be a white-noise distribution.

In FIG. 2A, the input signal u(t) can be presented by Laplace-transform, and the analog signal u(n), the quantization error e(n) and the digital output y(n) can be presented by z-transform. Being widely used in digital signal processing, Laplace-transform and the Z-transform are used to respectively convert a continuous-time signal and a discrete-time signal into a complex frequency domain representation.

Figure 2B:
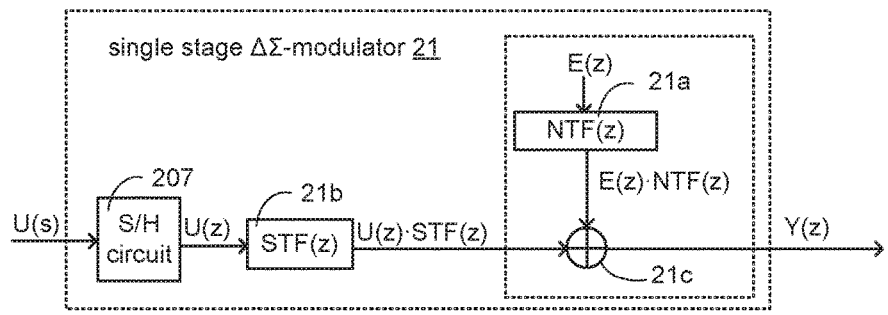
FIG. 2B is a schematic diagram illustrating a linear model of the single stage $\Delta\Sigma$-modulator in FIG. 2A.

FIG. 2B is a schematic diagram illustrating a linear model of the single stage ΔΣ-modulator in FIG. 2A. In FIG. 2B, a functional block 21b corresponds to a signal transfer function STF(z), and another functional block 21a corresponds to a noise transfer function NTF(z).

These functional blocks 21a, 211b are determined by the feedback (loop) based structure in FIG. 2A, and the transfer function of the loop filter 203 is H(z). The signal transfer function STF(z) of the single stage ΔΣ-modulator 21 is given by:

$$STF(z)=H(z)/(1+H(z)) \qquad \text{equation (1)}$$

The noise transfer function NTF(z) corresponding to the quantization error E(z) of the single stage ΔΣ-modulator 21 is given by:

$$NTF(z)=1/(1+H(z)) \qquad \text{equation (2)}$$

The single stage ΔΣ-modulator 21 can be characterized as a two input linear system with a noise (quantization error) transfer function NTF(z) and a signal transfer function STF(z), in which the digital output in discrete time Y(z) is given by equation (3).

$$Y(z)=STF(z)\cdot U(z)+NTF(z)E(z) \qquad \text{equation (3)}$$

Figure 3A:
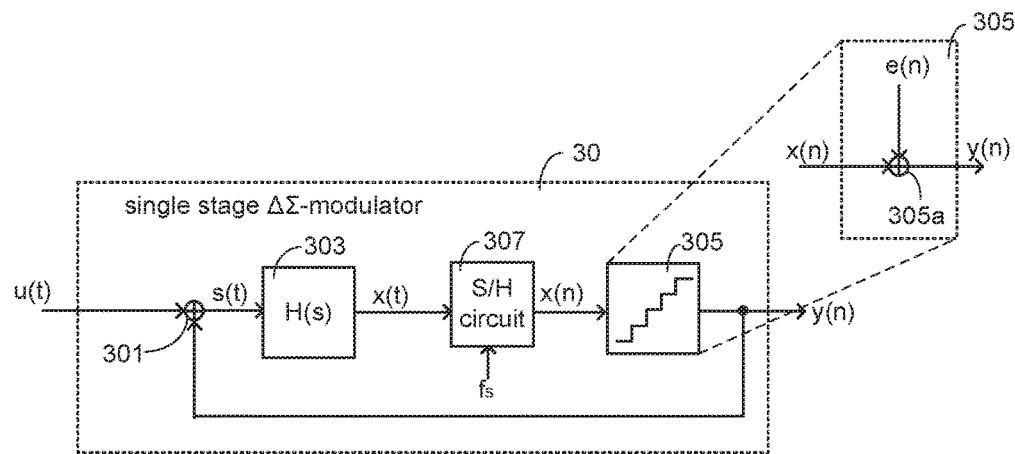
FIG. 3A is a schematic diagram illustrating an overall structure of a single stage $\Delta\Sigma$-modulator from the perspective of discrete time.

FIG. 3A is a schematic diagram illustrating an overall structure of a single stage ΔΣ-modulator from the perspective of discrete time. The single stage ΔΣ-modulator 30 includes a loop filter 303, a sample and hold (S/H) circuit 307, a quantizer 305, and a summer 301. Instead of being coupled to the summer 301, the S/H circuit 307 is coupled between the loop filter 303 and the quantizer 305. The loop filter 303 is a continuous time loop filter, whose transfer function is H(s).

The summer 301 receives an input signal u(t) and a digital output y(n) of the single stage ΔΣ-modulator 30. An output of the summer 301, that is, s(t), can be considered as a delta signal s(t), and an output of the loop filter 303, that is, x(n), can be considered as a sigma signal x(t). In FIG. 3A, the summer 301 subtracts the digital output y(n) from the input signal u(t) to obtain the delta signal s(t). The loop filter 303 receives and filters the delta signal s(t) to generate the sigma signal x(t).

The S/H circuit 307 samples and holds the sigma signal in continuous time x(t) and generates the sigma signal in discrete time x(n). Then, the discrete format of the sigma signal x(n) is transmitted to the quantizer 305. Later, the quantizer 305 quantizes the sigma signal x(n) and generates the digital output y(n). The flow is recursively executed because of the feedback loop based design.

Because the positions of the S/H circuits 207, 307 in FIGS. 2A and 3A are different, input and output of the summers 201, 301, the loop filters 203, 303, the S/H circuits 207, 307 are different. On the other hand, the operation of the quantizer 205 in FIG. 2A and the operation of the quantizer 305 in FIG. 3A are basically similar. That is, both the quantizers 205, 305 receive the sigma signals in discrete time x(n) and generate the digital output in discrete time y(n). Therefore, the linear model of the quantizer 305 is the same as the one in FIG. 2A. Similarly, in FIG. 3A, the signals and transfer function can be converted by Laplace-transform and Z-transform.

Figure 3B:
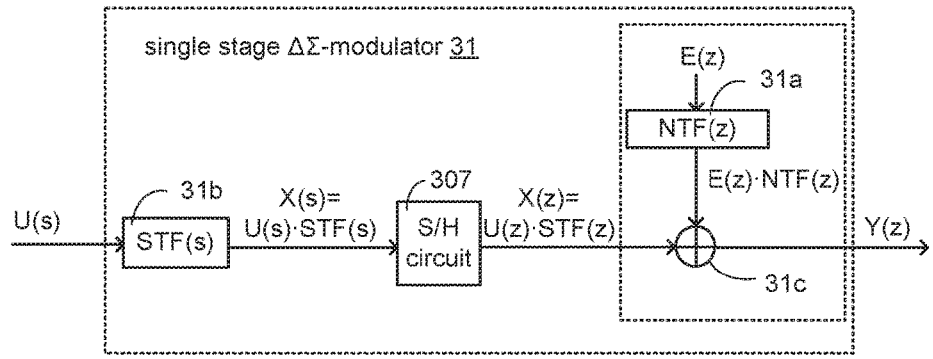
FIG. 3B is a schematic diagram illustrating a linear model of the single stage $\Delta\Sigma$-modulator in FIG. 3A.

FIG. 3B is a schematic diagram illustrating a linear model of the single stage ΔΣ-modulator in FIG. 3A. In equation (4), the sigma signal X(s) can be represented by the signal transfer function STF(s) and the input signal U(s). Because the S/H circuit 31d converts the continuous time characteristics to the discrete time characteristics, the output of the S/H circuit 31d can be represented by equation (5), which can be directly conducted by transforming equation (4) with z-transform representation.

$$X(s) = STF(s) \cdot U(s) \quad \text{equation (4)}$$

$$X(z) = STF(z) \cdot U(z) \quad \text{equation (5)}$$

The noise transfer function NTF(z) and the signal transfer function STF(s) are represented in functional blocks 31a, 31b. The functional blocks 31a, 31b are determined by the feedback based design in FIG. 3A and the transfer function of the loop filter 303 H(s). The signal transfer function STF(s) of the single stage ΔΣ-modulator 31 is given by:

$$STF(s) = H(s)/(1+H(s)) \quad \text{equation (6)}$$

The noise transfer function NTF(z) of the single stage ΔΣ-modulator 31 is given by equation (7). In equation (7), the transfer function H(z) can be obtained by transforming the transfer function H(s) from s-domain representation to z-domain representation.

$$NTF(z) = 1/(1+H(z)) \quad \text{equation (7)}$$

Similarly, the single stage ΔΣ-modulator can be characterized as a two input linear system with the noise transfer function NTF(z) and the signal transfer function STF(z), and the digital output of the ΔΣ-modulator is given by equation (8).

$$Y(z) = STF(s) \cdot U(z) + NTF(z)E(z) \quad \text{equation (8)}$$

As illustrated above, equations (3) and (8) are respectively corresponding to the digital outputs Y(z) of the single stage ΔΣ-modulator based on discrete time and continuous time. Based on equations (3) and (8), it can be concluded that how the single stage ΔΣ-modulators in FIGS. 2A, 2B digitize the input signal u(t) and generate the digital output y(n) are basically identical with how the single stage ΔΣ-modulators in FIGS. 3A, 3B do. Therefore, the ΔΣ-modulator can be designed in discrete time and/or continuous time.

Figure 4:
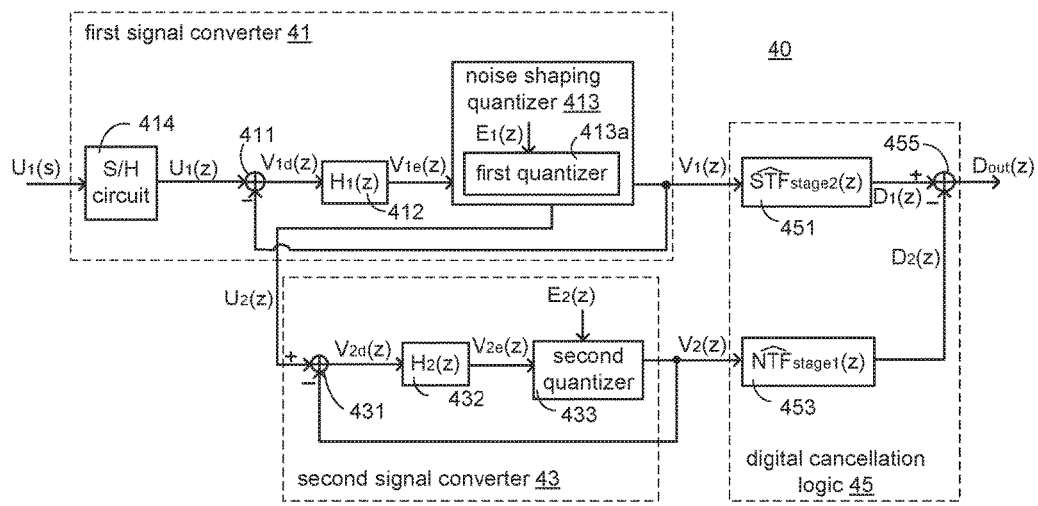
FIG. 4 is a schematic diagram illustrating a $\Delta\Sigma$-modulator according to an embodiment of the present disclosure.
Figure 5A:
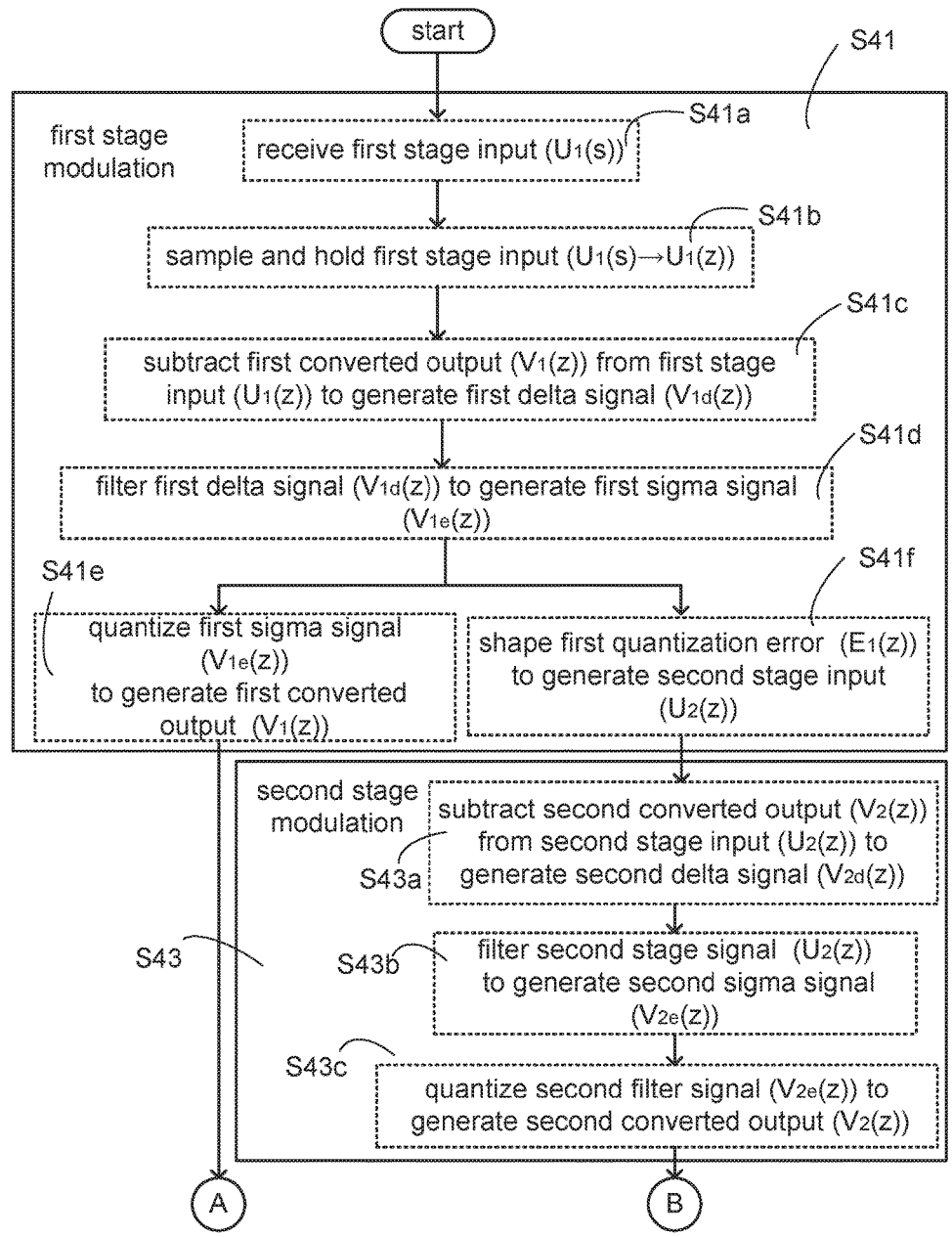
FIGS. 5A and 5B is a flow diagram illustrating the data conversion method of the MASH structure based $\Delta\Sigma$-modulator in FIG. 4.
Figure 5B:
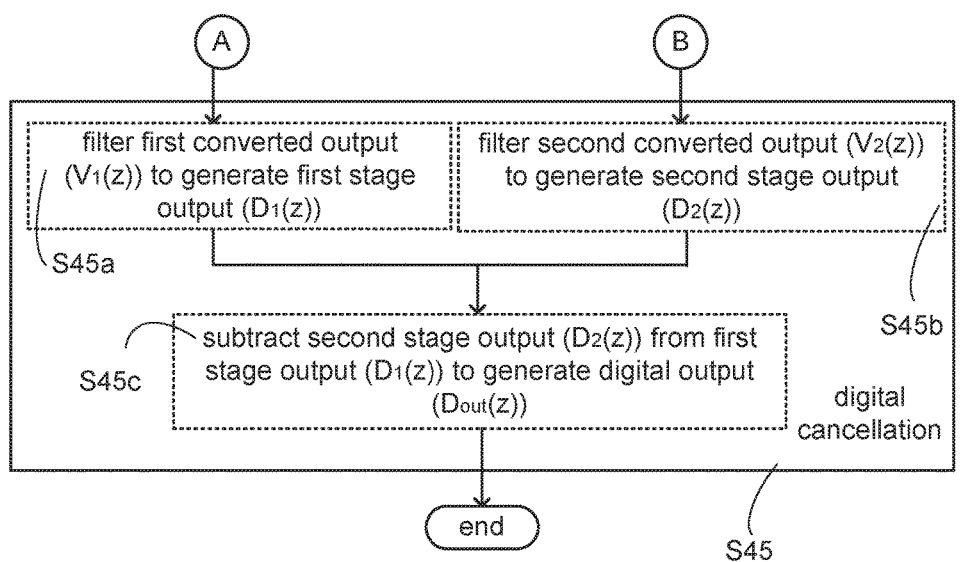
Figure 6:
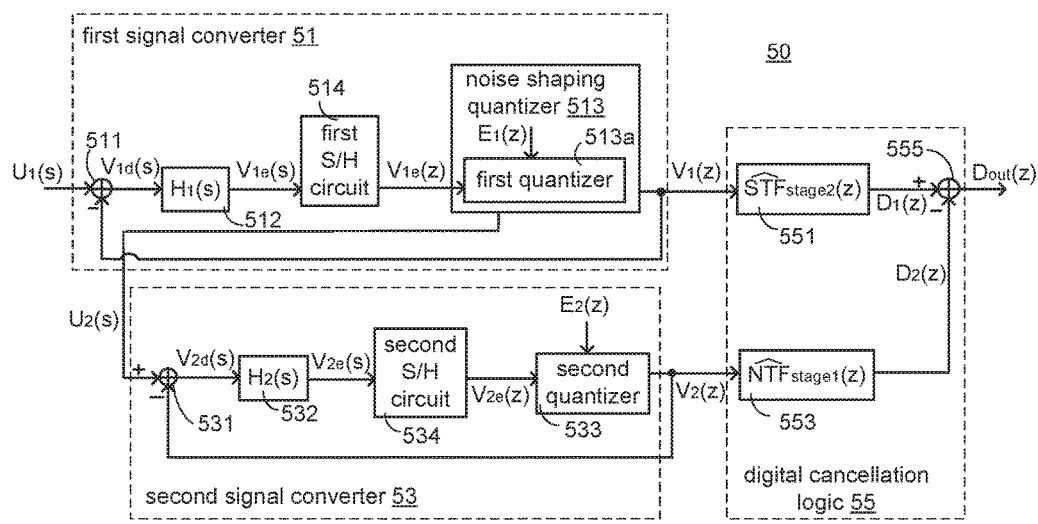
FIG. 6 is a schematic diagram illustrating a $\Delta\Sigma$-modulator according to another embodiment of the present disclosure.
Figure 7A:
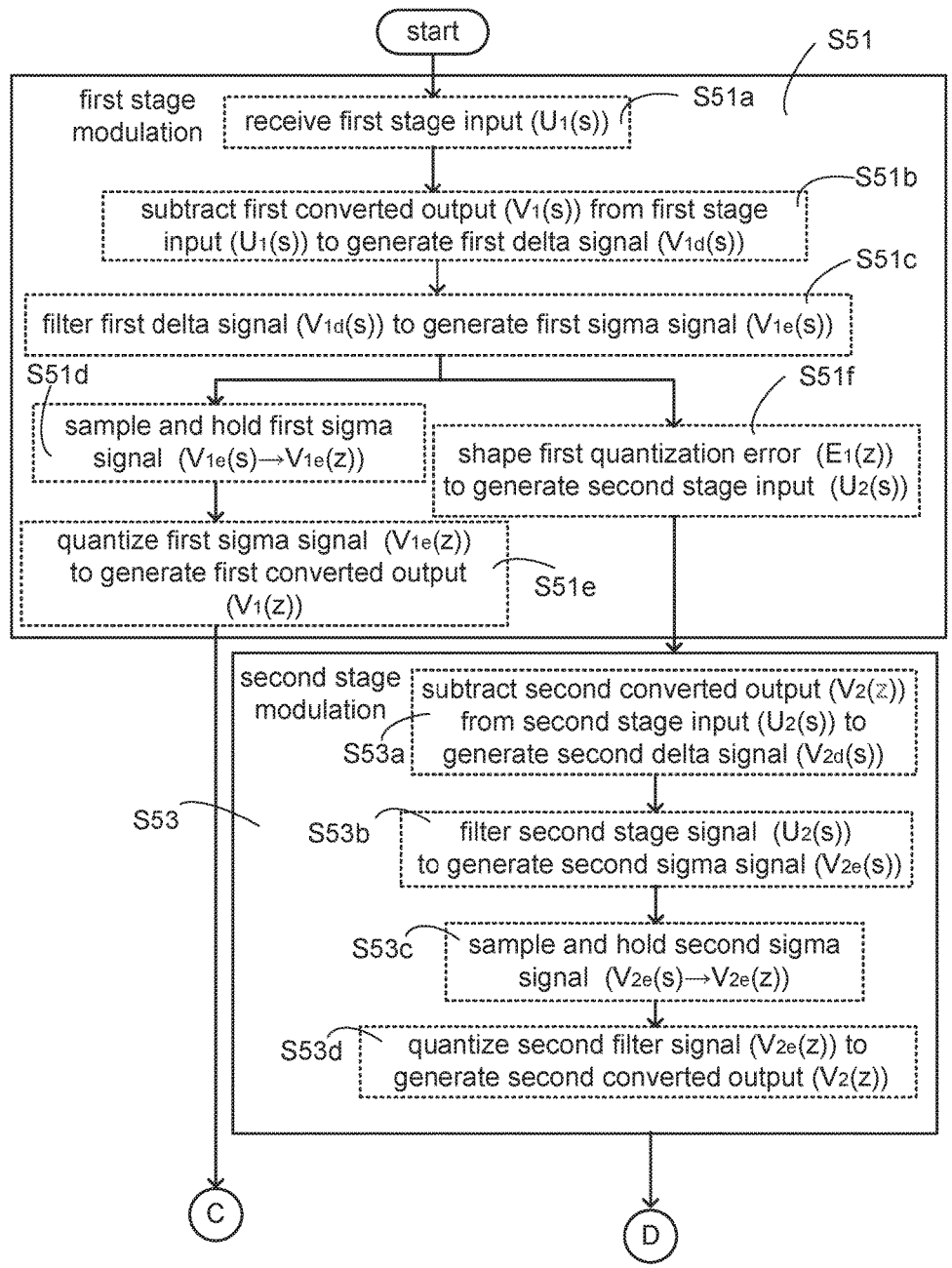
FIGS. 7A and 7B is a flow diagram illustrating the data conversion method of the MASH structure based $\Delta\Sigma$-modulator in FIG. 6.
Figure 7B:
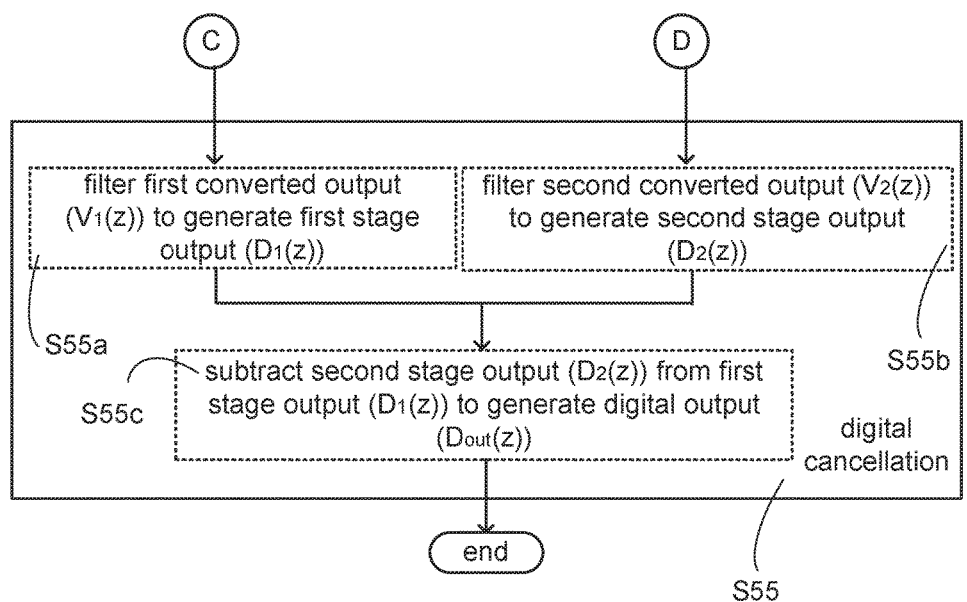

According to the present disclosure, the ΔΣ-modulator can be implemented based on a multi stage noise shaping (hereinafter, MASH) structure. The MASH structure based ΔΣ-modulator has the advantages of inherent stability, high dynamic range, and high overload input level. Similar to the single stage ΔΣ-modulator, the MASH structure based ΔΣ-modulator can be designed in discrete time and/or continuous time. FIGS. 4, 5A, 5B are corresponding to the MASH structure based ΔΣ-modulator being designed based on the discrete time perspective, and FIGS. 6, 7A, 7B are corresponding to the MASH structure based ΔΣ-modulator being designed based on the continuous time perspective.

FIG. 4 is a schematic diagram illustrating a ΔΣ-modulator according to an embodiment of the present disclosure. The ΔΣ-modulator 40 includes a first signal converter 41, a second signal converter 43 and a digital cancellation logic 45. The MASH structure based ΔΣ-modulator 40 digitizes a first stage input in continuous time $U_1(s)$ to a digital output in discrete time $D_{out}(z)$.

The first signal converter 41 includes a S/H circuit 414, a first input summer 411, a first loop filter 412, and a noise shaping quantizer 413. The noise shaping quantizer 413 can be, for example, a noise shaped successive approximation register (hereinafter, NS-SAR), and the noise shaping quantizer 413 includes a first quantizer 413a.

The second signal converter 43 includes a second input summer 431, a second loop filter 432 and a second quantizer 433. In FIG. 4, the second signal converter 43 is assumed to be a single-stage ΔΣ-modulator. However, the second signal converter can also be a pipeline-based ADC, a successive approximation register (hereinafter, SAR), an NS-SAR, or a noise shaped ADC etc.

The digital cancellation logic 45 further includes digital cancellation filters 451, 453, and an output summer 455. The digital cancellation filters 451, 453 are on-chip filters used to attenuate signals and noise that are outside the band of interest. The first loop filter 412 and the second loop filter 432 are analog loop filters, and the digital cancellation filters 451, 453 are digital filters.

The ΔΣ-modulator 40 can be separated to an upper path and a lower path. The upper path includes the first signal converter 41, the digital cancellation filter 451, and the output summer 455. The lower path includes the second signal converter 43 and the digital cancellation filter 453.

FIGS. 5A and 5B is a flow diagram illustrating the data conversion method of the MASH structure based ΔΣ-modulator in FIG. 4. The operation of the ΔΣ-modulator 40 includes three parts: the first signal converter 41 performs a first stage modulation to a first stage input in continuous time $U_1(s)$ (step S41), the second signal converter 43 performs a second stage modulation to a second stage input in discrete time $U_2(z)$ (step S43), and the digital cancellation logic 45 performs a digital cancellation operation to generate the digital output in discrete time $D_{out}(z)$ (step S45).

After receiving the first stage input in continuous time $U_1(s)$ (step S41a), the S/H circuit 414 samples and holds the first stage input in continuous time $U_1(s)$ and generates the first stage input in discrete time $U_1(z)$ (step S41b). The first input summer 411 receives the first stage input in discrete time $U_1(z)$. Then, the first input summer 411 subtracts the first converted output in discrete time $V_1(z)$ from the first stage input in discrete time $U_1(z)$ to generate a first delta signal in discrete time $V_{1d}(z)$ (step S41c). The first loop filter 412 filters the first stage input in discrete time $U_{1d}(z)$ to generate the first sigma signal in discrete time $V_{1e}(z)$ (step S41d). Moreover, the noise shaping quantizer 413 quantizes the first sigma signal in discrete time $V_{1e}(z)$ to generate the first converted output in discrete time $V_1(z)$ (step S41e), and shapes a first stage quantization error in discrete time $E_1(z)$ to generate the second stage input in discrete time $U_2(z)$ (step S41f). By shaping the first stage quantization error in discrete time $E_1(z)$, the noise shaping quantizer 413 suppresses and/or reduces the first stage quantization error in discrete time $E_1(z)$. The first converted output in discrete time $V_1(z)$ is transmitted to the digital cancellation logic 45, and the second stage input in discrete time $U_2(z)$ is transmitted to the second signal converter 43.

Alternatively speaking, the first stage quantization error in discrete time $E_1(z)$ is shaped by the noise shaping quantizer 413 in order to generate the second stage input in discrete time $U_2(z)$. After its generation, the second stage input in discrete time $U_2(z)$ is injected to the second signal converter 43. Details about generation of the second stage input in discrete time $U_2(z)$ will be illustrated later.

In the lower path, the second input summer 431 subtracts the second converted output in discrete time $V_2(z)$ from the second stage input in discrete time $U_2(z)$ to generate a second delta signal in discrete time $V_{2d}(z)$ (step S43a). Then, the second loop filter 432 filters the second delta signal in discrete time $V_{2d}(z)$ to generate a second sigma signal in discrete time $V_{2e}(z)$ (step S43b). The second quantizer 433 quantizes the second sigma signal in discrete time $V_{2e}(z)$ to generate the second converted output in discrete time $V_2(z)$ (step S43c).

The digital cancellation filter 451 receives and filters the first converted output in discrete time $V_1(z)$ to generate a first stage output in discrete time $D_1(z)$ (step S45a). The digital cancellation filter 453 receives and filters the second converted output in discrete time $V_2(z)$ to generate a second stage output in discrete time $D_2(z)$ (step S45b). Then, the output summer 455 subtracts the second output in discrete time $D_2(z)$ from the first stage output in discrete time $D_1(z)$ in order to generate the digital output in discrete time $D_{out}(z)$ (step S45c).

The transfer function of the first loop filter 412 is represented as $H_1(z)$, and a first stage quantization error in discrete time $E_1(z)$ is inherent in quantization operation of the first quantizer 413a.

A noise shaped quantization error in discrete time $E_{NTF1}(z)$ represents the first stage quantization error in discrete time $E_1(z)$ after being shaped, that is, $E_{NTF1}(z) = NTF_x(z) \cdot E_1(z)$. The linear models of the first signal converter 41 can be analogous to the one in FIG. 2B by replacing the quantization error in discrete time $E(z)$ in FIG. 2B with the noise shaped quantization error in discrete time $E_{NTF1}(z)$. The Z-domain representation of operation of the first signal converter 41 can be defined as follows.

$$V_1(z) = STF_{stage1}(z) \cdot U_1(z) + NTF_{stage1}(z) \cdot E_{NTF1}(z) = \\ STF_{stage1}(z) \cdot U_1(z) + NTF_{stage1}(z) \cdot (NTF_x(z) \cdot E_1(z))$$

equation (9)

The first stage input in discrete time $U_1(z)$ is related to a first stage signal transfer function $STF_{stage1}(z)$. The first stage quantization error in discrete time $E_1(z)$ is related to the first stage noise transfer function $NTF_{stage1}(z)$ and a noise shaping transfer function $NTF_x(z)$.

The linear model of the second signal converter 43 can be analogous to the one in FIG. 2B by replacing the quantization error in discrete time $E(z)$ in FIG. 2B with the second stage quantization error in discrete time $E_2(z)$. The Z-domain representation of operation of the second signal converter 43 can be represented in equation (10).

$$V_2(z) = STF_{stage2}(z) \cdot U_2(z) + NTF_{stage2}(z) \cdot E_2(z)$$

equation (10)

The second stage input in discrete time $U_2(z)$ is related to the second stage signal transfer function $STF_{stage2}(z)$. The second stage quantization error in discrete time $E_2(z)$ is related to the second stage noise transfer function $NTF_{stage2}$.

According to the right member of equation (10), the noise related term of the second converted output in discrete time $V_2(z)$, that is, $NTF_{stage2}(z) \cdot E_2(z)$, indicates that the second stage quantization error in discrete time $E_2(z)$ is affected by only the second stage noise transfer function $NTF_{stage2}(z)$. Whereas, according to the right member of equation (9), $NTF_{stage1}(z) \cdot NTF_x(z) \cdot E_1(z)$, indicates that the first stage quantization error in discrete time $E_1(z)$ is affected by both the first stage noise transfer function $NTF_{stage1}(z)$ and an additional noise shaping transfer function $NTF_x(z)$.

For the first signal converter 41, the first stage signal transfer function $STF_{stage1}(z)$, and the first stage noise transfer function $NTF_{stage1}(z)$ can be represented based on the transfer function of the first loop filter 412, that is, $H_1(z)$. The first stage signal transfer function $STF_{stage1}(z)$ is given by equation (11), and the first stage noise transfer function $NTF_{stage1}(z)$ is given by equation (12).

$$STF_{stage1}(z) = H_1(z)/(1 + H_1(z))$$

equation (11)

$$NTF_{stage1}(z) = 1/(1 + H_1(z))$$

equation (12)

For the second signal converter 43, the second stage signal transfer function $STF_{stage2}(z)$, and the second stage noise transfer function $NTF_{stage2}(z)$ can be represented based on the transfer function of the second loop filter 432, that is, $H_2(z)$. The second stage signal transfer function $STF_{stage2}(z)$ can be represented as equation (13), and the second stage noise transfer function $NTF_{stage2}(z)$ can be represented as equation (14).

$$STF_{stage2}(z) = H_2(z)/(1 + H_2(z))$$

equation (13)

$$NTF_{stage2}(z) = 1/(1 + H_2(z))$$

equation (14)

In the following descriptions, a circumflex over the transfer function represents that the component is a digital based design. For example, a circumflex over the second stage signal transfer function $\hat{STF}_{stage2}(z)$ represents a transfer function of the digital cancellation filter 451, and a circumflex over the first stage noise transfer function $\hat{NTF}_{stage1}(z)$ represents a transfer function of the digital cancellation filter 453.

According to the first converted output in discrete time $V_1(z)$ (as shown in equation (9)) and the transfer function of the digital cancellation filter 451 (that is, the circumflex over the second stage signal transfer function $\hat{STF}_{stage2}(z)$), the first stage output in discrete time $D_1(z)$ generated by the digital cancellation filter 451 can be represented by equation (15).

$$D_1(z) = V_1(z) \cdot \hat{STF}_{stage2}(z) = \\ (STF_{stage1}(z) \cdot U_1(z) + NTF_{stage1}(z) \cdot NTF_x(z) \cdot E_1(z)) \cdot \\ \hat{STF}_{stage2}(z)$$

equation (15)

Similarly, in the lower path, according to the second converted output $V_2(z)$ (as shown in equation (10)) and the transfer function of the digital cancellation filter 453 (that is, the circumflex over the first stage noise transfer function $\hat{NTF}_{stage1}(z)$), the second stage output $D_2(z)$ generated by the digital cancellation filter 453 can be represented by equation (16).

$$D_2(z) = V_2(z) \cdot \hat{NTF}_{stage1}(z) = \\ (STF_{stage2}(z) \cdot NTF_x \cdot E_1(z) + NTF_{stage2}(z) \cdot E_2(z)) \cdot \\ \hat{NTF}_{stage1}(z)$$

equation (16)

In short, the MASH structure based $\Delta\Sigma$-modulator allows us to cancel and shape the first stage quantization error in discrete time $E_1(z)$. The output of the MASH structure based $\Delta\Sigma$-modulator 40, the digital output $D_{out}$ can be obtained by subtracting the second stage output in discrete time $D_2(z)$ from the first stage output in discrete time $D_1(z)$ ($D_{out}(z)=D_1(z)-D_2(z)$). Basically, the digital output in discrete time $D_{out}(z)$ can be generated by summation or difference of the second stage output in discrete time $D_2(z)$ and the first stage output in discrete time $D_1(z)$. The signal phases of the second stage output in discrete time $D_2(z)$ and the first stage output in discrete time $D_1(z)$ jointly determine whether a summation or a subtraction operation is performed by the output summer 455. In equation (17), the first stage output in discrete time $D_1(z)$ in equation (15) and the second stage output in discrete time $D_2(z)$ in equation (16) can be used for substitution.

$$\begin{aligned}D_{out}(z) = D_1(z) - D_2(z) = \quad & \text{equation (17)}\\ (STF_{stage1}(z) \cdot U_1(z) + NTF_{stage1}(z) \cdot NTF_x(z) \cdot E_1(z)) \cdot &\\ S\hat{T}F_{stage2}(z) - (STF_{stage2}(z) \cdot NTF_x(z) \cdot E_1(z) + &\\ NTF_{stage2}(z) \cdot E_2(z)) \cdot N\hat{T}F_{stage1}(z) = &\\ STF_{stage1}(z) \cdot U_1(z) \cdot S\hat{T}F_{stage2}(z) + &\\ NTF_{stage1}(z) \cdot E_1(z) \cdot NTF_x(z) \cdot S\hat{T}F_{stage2}(z) - &\\ STF_{stage2}(z) \cdot E_1(z) \cdot NTF_x(z) \cdot N\hat{T}F_{stage1}(z) - &\\ NTF_{stage2}(z) \cdot E_2(z) \cdot N\hat{T}F_{stage1}(z) = &\\ (STF_{stage1}(z) \cdot STF_{stage2}(z)) \cdot U_1(z) + &\\ \left(NTF_{stage1}(z) \cdot S\hat{T}F_{stage2}(z) - \right. &\\ \left. STF_{stage2}(z) \cdot N\hat{T}F_{stage1}(z)\right) \cdot NTF_x(z) \cdot &\\ E_1(z) + \left(N\hat{T}F_{stage1}(z) \cdot NTF_{stage2}(z)\right) \cdot E_2(z) &\end{aligned}$$

According to the right member of equation (17), the output signal in discrete time $D_{out}(z)$ includes three terms, and each of these three terms is related to different signals. Basically, the first term in equation (17), $STF_{stage1}(z) \cdot STF_{stage2}(z) \cdot U_1(z)$, represents that the first stage input in discrete time $U_1(z)$ is related to the first stage signal transfer function $STF_{stage1}(z)$ and the second stage signal transfer function $STF_{stage2}(z)$. The second term in equation (17), $NTF_{stage1}(z) \cdot S\hat{T}F_{stage2}(z) - STF_{stage2}(z) \cdot N\hat{T}F_{stage1}(z)) \cdot NTF_x(z) \cdot E_1(z)$, represents that the first stage quantization error in discrete time $E_1(z)$ is related to the first stage noise transfer function $NTF_{stage1}(z)$, the circumflex over the second stage noise transfer function $S\hat{T}F_{stage2}(z)$, the second stage signal transfer function $STF_{stage2}(z)$, the circumflex over first stage noise transfer function $N\hat{T}F_1(z)$, and the noise shaping transfer function $NTF_x(z)$. The third term in equation (17), $(N\hat{T}F_{stage1}(z) \cdot NTF_{stage2}(z)) \cdot E_2(z)$, represents that the second stage quantization error in discrete time $E_2(z)$ is related to the circumflex over first stage noise transfer function, $N\hat{T}F_{stage1}(z)$ and the second stage noise transfer function $NTF_{stage2}(z)$.

Accordingly, designs of the first signal converter 41 and the second signal converter 43 jointly affect the first stage input in continuous time $U_1(s)$, designs of the first signal converter 41, the digital cancellation filter 451, the second signal converter 43, the digital cancellation filter 453, and the noise shaping quantizer 413 jointly affect the first stage quantization error in discrete time $E_1(z)$, and designs of the digital cancellation filter 453 and the second signal converter 43 jointly affect the second stage quantization error in discrete time $E_2(z)$.

Among the three terms in equation (17), only the first term is the desired effect of the $\Delta\Sigma$-modulator 40, and the rest terms are corresponding to inherent but undesired side effects of the $\Delta\Sigma$-modulator 40. Since the second stage quantization error in discrete time $E_2(z)$ is relatively much smaller than the first stage quantization error in discrete time $E_1(z)$, the quality of the $\Delta\Sigma$-modulator 40 is mainly determined by magnitude of the second term in equation (17).

According to equation (17), the parameters in the parentheses of the second term can be defined as a residue error in discrete time $\Delta(z)$. That is, $\Delta(z)=(NTF_{stage1}(z) \cdot S\hat{T}F_{stage2}(z)-STF_{stage2}(z) \cdot N\hat{T}F_{stage1}(z))$. Accordingly, equation (17) can be further represented as equation (18).

$$D_{out}(z)=STF_{stage1}(z) \cdot STF_{stage2}(z) \cdot U(z)+\Delta \cdot NTF_x(z) \cdot E_1(z)+N\hat{T}F_{stage1}(z) \cdot NTF_{stage2}(z) \cdot E_2(z) \quad \text{equation (18)}$$

Under certain circumstances, the residue error $\Delta(z)$ can represent similarity between the first stage noise transfer function $NTF_{stage1}$ and the transfer function of the digital cancellation filter 453 $N\hat{T}F_{stage1}(z)$ and similarity between the transfer function of the digital cancellation filter 451 $S\hat{T}F_{stage2}(z)$ and the second stage noise transfer function $STF_{stage2}(z)$. The residue error $\Delta(z)$ can be minimized to 0 if the circumflex over the second stage transfer function $S\hat{T}F_{stage2}(z)$ (provided by the digital cancellation filter 451) is equivalent to second stage signal transfer function $STF_{stage2}(z)$, and if the circumflex over the first stage noise transfer function $N\hat{T}F_1(z)$ (provided by the digital cancellation filter 453) is equivalent to the first stage noise transfer function $NTF_{stage1}(z)$. That is, $S\hat{T}F_{stage2}(z)=STF_{stage2}(z)$ and $N\hat{T}F_{stage1}(z)=NTF_{stage1}(z)$. In other words, the residue error $\Delta(z)$ can be equivalent to "0" if perfect match between the digital cancellation filters 451, 453 and the analog transfer functions associated with the first loop filter 412 and the noise shaping quantizer 413 can be achieved.

Alternatively speaking, if we can precisely know the first stage noise transfer function $NTF_{stage1}(z)$ and the second stage signal transfer function $STF_{stage2}(z)$, design of the digital cancellation filter 451, 453 can be easily determined. However, in practice, it is not possible to precisely model these two transfer functions because the first stage noise transfer function $NTF_{stage}$ is a function of the sensing element and the second stage signal transfer function $STF_{stage2}(z)$ is a function of analog electrics. Both the sensing element and the analog electrics are subject to manufacturing tolerances and imperfections. Therefore, a mismatch between transfer functions of the digital cancelation filters ($S\hat{T}F_{stage2}(z)$ and $N\hat{T}F_{stage1}(z)$) and the analog components ($STF_{stage2}(z)$ and $NTF_{stage1}(z)$) may occur, and the mismatch degrades the performance of the modulator.

If the residue error in discrete time $\Delta(z)$ is not equivalent to "0", a path mismatch between analog component and the digital cancellation filters exists, and the path mismatch may cause serious performance degradation. This path mismatch may cause a leakage of the first stage quantization error in discrete time $E_1(z)$ and degrade the modulator performance.

According to the second term of the right member in equation (20), the noise shaping transfer function $NTF_x(z)$ can suppress the residue error in discrete time $\Delta(z)$ and the first stage quantization error in discrete time $E_1(z)$, that is, $(\Delta(z) \cdot E_1(z))$, in the low frequency band. Consequently, the side effects caused by the residue error in discrete time $\Delta(z)$ (mismatch degree) is decreased.

FIG. 6 is a schematic diagram illustrating a $\Delta\Sigma$-modulator according to another embodiment of the present disclosure. The $\Delta\Sigma$-modulator 50 includes a first signal converter 51, a second signal converter 53 and a digital cancellation logic 55. The MASH structure based $\Delta\Sigma$-modulator 50 digitizes a first stage input $U_1$ to a digital output $D_{out}$.

The first signal converter 51 includes a first input summer 511, a first loop filter 512, a first S/H circuit 514, and a noise shaping quantizer 513. The noise shaping quantizer 513 can be, for example, a noise shaped successive approximation register (hereinafter, NS-SAR).

The second signal converter 53 includes a second input summer 531, a second loop filter 532, a second S/H circuit 534 and a second quantizer 533. In FIG. 6, the second signal converter 53 is assumed to be a single-stage $\Delta\Sigma$-modulator. However, the second signal converter 53 can also be a pipeline-based ADC, a successive approximation register (hereinafter, SAR), an NS-SAR, or a noise shaped ADC etc.

The digital cancellation logic 55 further includes digital cancellation filters 551, 553, and an output summer 555. The first loop filter 512 and the second loop filter 532 are analog loop filters, and the digital cancellation filters 551, 553 are digital filters.

The $\Delta\Sigma$-modulator 50 can be separated to an upper path and a lower path. The upper path includes the first signal converter 51, the digital cancellation filter 551, and the output summer 555. The lower path includes the second signal converter 53 and the digital cancellation filter 553. The digital cancellation filters 551, 553 in the digital cancellation logic 55 are on-chip filters used to attenuate signals and noise that are outside the band of interest.

FIGS. 7A and 7B is a flow diagram illustrating the data conversion method of the MASH structure based $\Delta\Sigma$-modulator in FIG. 6. The operation of the $\Delta\Sigma$-modulator 50 includes three parts: the first signal converter 51 performs a first stage modulation to a first stage input in continuous time $U_1(s)$ (step S51), the second signal converter 53 performs a second stage modulation to a second stage input in continuous time $U_2(s)$ (step S53), and the digital cancellation logic performs a digital cancellation operation to generate the digital output in discrete time $D_{out}(z)$ (step S55).

The first input summer 511 firstly receives the first stage input in continuous time $U_1(x)$ (step S51a). Then, the first input summer 511 subtracts a first converted output in continuous time $V_1(s)$ from the first stage input in continuous time $U_1(s)$ to generate a first delta signal in continuous time $V_{1d}(s)$ (step S51b). The first loop filter 512 filters the first stage input in continuous time $U_{1d}(s)$ to generate the first sigma signal in continuous time $V_{1e}(s)$ (step S51c).

After receiving the first sigma signal in continuous time $V_{1e}(s)$, the first S/H circuit 513b samples and holds the first sigma signal in continuous time $V_{1e}(s)$, and accordingly generates the first sigma signal in discrete time $V_{1e}(z)$ (step S51d). Moreover, the noise shaping quantizer 513 quantizes the first sigma signal in discrete time $V_{1e}(z)$ to generate the first converted output $V_1(z)$ (step S51e), and shapes the first stage quantization error in discrete time $E_1(z)$ to generate the second stage input in continuous time $U_2(s)$ (step S51f). By shaping the first stage quantization error in discrete time $E_1(z)$, the noise shaping quantizer 513 suppresses and/or reduces the first stage quantization error in discrete time $E_1(z)$. The first converted output in discrete time $V_1(z)$ is transmitted to the digital cancellation logic 45, and the second stage input in continuous time $U_2(s)$ is transmitted to the second signal converter 53.

Alternatively speaking, the first stage quantization error in discrete time $E_1(z)$ is shaped by the noise shaping quantizer 513 in order to generate the second stage input in continuous time $U_2(s)$. After its generation, the second stage input in continuous time $U_2(s)$ is injected to the second signal converter 53. Details about generation of the second stage input in continuous time $U_2(s)$ will be illustrated later.

In the lower path, the second input summer 531 firstly receives the second stage input in continuous time $U_2(s)$ from the first signal converter 51. The second input summer 531 subtracts the second converted output in discrete time $V_2(z)$ from the second stage input in continuous time $U_2(s)$ to generate a second delta signal in continuous time $V_{2d}(s)$ (step S53a). Then, the second loop filter 532 filters the second delta signal in continuous time $V_{2d}(s)$ to generate a second sigma signal in continuous time $V_{2e}(s)$ (step S53b).

After receiving the second sigma signal in continuous time $V_{2e}(s)$, the second S/H circuit 534 samples and holds the second sigma signal in continuous time $V_{2e}(s)$ and generates the second sigma signal in discrete time $V_{2e}(z)$ (step S53c). Then, the second quantizer 533 quantizes the second sigma signal in discrete time $V_{2e}(z)$ to generate the second converted output in discrete time $V_2(z)$ (step S53d).

The operations of the digital cancellation filters 551, 553 are similar to those of the digital cancellation filters 451, 453. Therefore, steps S55a, S55b, S55c are the same as steps S45a, 45b, S45c and details about step S55 are omitted here for brevity.

The $\Delta\Sigma$-modulator 40 in FIG. 4 and the $\Delta\Sigma$-modulator 50 in FIG. 6 are highly similar to each other, except the positions of the S/H circuits. The positions of the S/H circuits are related to when the signals are transformed from continuous time to discrete time, and the operations of the $\Delta\Sigma$-modulators 40, 50 are generally similar. Therefore, the transfer function of the first signal converter 41, the second signal converter 43, and the digital cancellation logic 45 in FIG. 4 can be applied to the first signal converter 51, the second signal converter 53, and the digital cancellation logic 55 in FIG. 6. Consequentially, equations (9), (10), (15), (16), (18) can be used to represent the first converted output in discrete time V1(z), the second converted output in discrete time V2(z), the first stage output in discrete time D1(z), the second stage output in discrete time D2(z), and the digital output in discrete time Dout(z), respectively.

The following embodiments demonstrate that the noise shaping transfer function $NTF_x$ is provided to ensure that the $\Delta\Sigma$-modulator is less sensitive to path mismatch. The embodiments shown in FIGS. 8-11, 13 are illustrated based on a comprehensive perspective view point. That is, FIGS. 8-11, 13 can be implemented under the scenario of continuous time and/or discrete time. In the following embodiments, the need for high accurate path matching can be alleviated once the input of the second signal converter (that is, the second stage input $U_2$) is generated by shaping the first stage quantization error in discrete time $E_1(z)$.

According to the present disclosure, the first stage quantization error $E_1$ is not directly transmitted to the second signal converter 43 but shaped in advance. The practical implementations of the first signal converter 41, for example, internal components and connections of the first signal converter 41, and how to shape first stage quantization error $E_1$ are not limited. Several embodiments are illustrated below.

Figure 8:
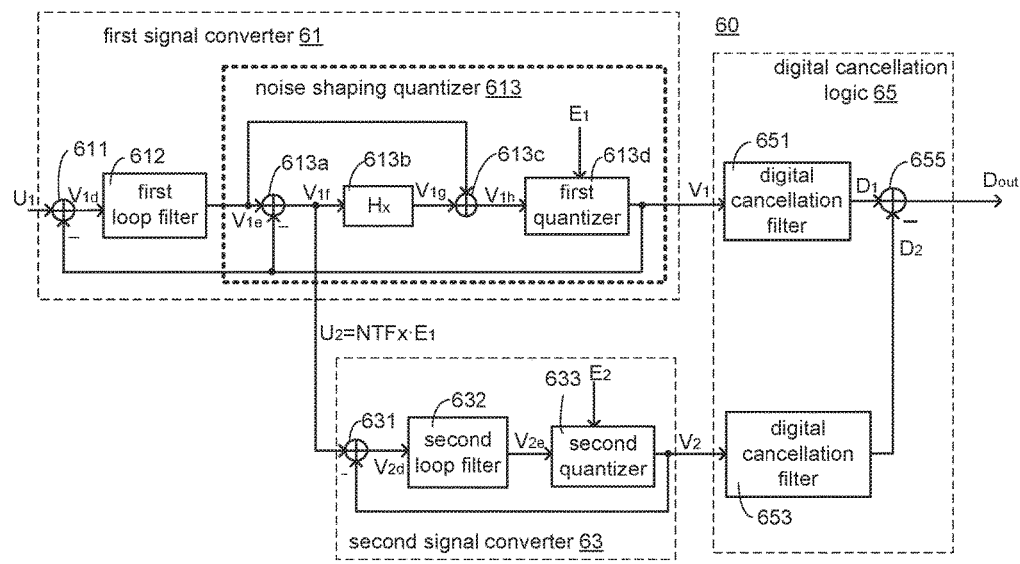
FIG. 8 is a schematic diagram illustrating a $\Delta\Sigma$-modulator according to another embodiment of the present disclosure.

FIG. 8 is a schematic diagram illustrating a $\Delta\Sigma$-modulator according to another embodiment of the present disclosure. The $\Delta\Sigma$-modulator 60 includes a first signal converter 61, a second signal converter 63 and a digital cancellation logic 65. The first stage quantization error $E_1$ and the second stage quantization error $E_2$ are respectively inherent in quantization operation of the first quantizer 613d and the second quantizer 633. In FIG. 8, the transfer functions of the first quantizer 613d and the second quantizer 633 are assumed to be "1".

The internal connections between and functions of the components in the first signal converter 61 are illustrated. The first signal converter 61 includes an input summer 611, a first loop filter 612, and a noise shaping quantizer 613, and the noise shaping quantizer 613 further includes a first inner summer 613a, a noise shaping filter 613b, a second inner summer 613c, and a first quantizer 613d.

The first loop filter 612 is coupled to the first input summer 611. The first input summer 611 subtracts the first converted output $V_1$ from the first stage input $U_1$ to generate the first delta signal $V_{1d}$. Then, the first loop filter 612 filters the first stage input $V_{1d}$ to generate the first sigma signal $V_{1e}$.

The first inner summer 613a is coupled to the first loop filter 612 and the digital cancellation logic 65. After receiving the first sigma signal V1e from the first loop filter 612, the first inner summer 613a sums the first converted output V1 and the first sigma signal V1e to generate a first inner summation signal V1f.

The noise shaping filter 613b is coupled to the first inner summer 613a and the second signal converter 63. The noise shaping filter 613b receives and filters the first inner summation signal $V_{1f}$. Then, the noise shaping filter 613b generates a noise shaping signal $V_{1g}$.

The second inner summer 613c is coupled to the first loop filter 612, the noise shaping filter 613b and the first inner summer 613a. The second inner summer 613c receives the noise shaping signal $V_{1g}$ and the first sigma signal $V_{1e}$ from the noise shaping filter 613b and the first loop filter 612, respectively. The second inner summer 613c sums the noise shaping signal $V_{1g}$ and the first sigma signal $V_{1e}$ to generate a second inner summation signal $V_{1h}$.

The first quantizer 613d is coupled to the input summer 611, the first inner summer 613a, the second inner summer 613c, and the digital cancellation logic 65. The first quantizer 613d quantizes the second inner summation signal $V_{1h}$ to generate the first converted output $V_1$.

While the first quantizer 613d quantizes the second inner summation signal $V_{1h}$, the noise shaping quantizer 613 shapes the inherent first stage quantization error $E_1$ of the first quantizer $E_1$, and the first inner summer 613a outputs the second stage input $U_2$. The noise shaping transfer function $NTF_x$ is jointly performed by the first inner summer 613a, the noise shaping filter 613b, the second inner summer 613c, and the first quantizer 613d.

The first converted output $V_1$ can be represented as equation (19).

$$V_1 = V_{1e} + NTF_x \cdot E_1 \quad \text{equation (19)}$$

As shown in FIG. 8, the first inner summation signal $V_{1f}$ is further utilized as the second stage input W. Based on the first converted output $V_1$ in equation (19), the operation of the first inner summer 613a can be represented by equation (20). According to equation (20), the first stage quantization error $E_1$ in this embodiment is not only shaped by $NTF_x$ but also inversed to generate the second stage input $U_2$.

$$\begin{aligned} U_2 &= V_{1e} - V_1 \quad \text{equation (20)} \\ &= V_{1e} - (V_{1e} + NTF_x \cdot E_1) \\ &= -NTF_x \cdot E_1 \end{aligned}$$

The second signal converter 63 includes a second input summer 631, a second loop filter 632 and a second quantizer 633. The second input summer 631 is coupled to the digital cancellation logic 65 and the first signal converter 61. The second loop filter 632 and the second quantizer 633 are coupled to the second input summer 531. The second quantizer 633 is also coupled to the digital cancellation logic 65.

In the second signal converter 63, the second input summer 631 receives the second stage input U2 from the noise shaping quantizer 613, and the second converted output V2 from the second quantizer 633. The second input summer 631 thus generates a second delta signal V2d. After receiving the second delta signal V2d, the second loop filter 632 filters the second delta signal V2d to generate a second sigma signal V2e. The second quantizer 633 quantizes the second sigma signal V2e to generate the second converted output V2.

The digital cancellation logic 65 includes digital cancellation filters 651, 653, and an output summer 655. The operation of the digital cancellation logic 65 is similar to the digital cancellation logics 45, 55 in FIGS. 4 and 6. Therefore, details of the digital cancellation logic 65 are omitted here for brevity.

As illustrated above, the ΔΣ-modulator 60 can be implemented under the scenario of continuous time and/or the scenario of discrete time. Depending on scenarios of implementation type, at least one S/H circuit is inserted in different positions of the ΔΣ-modulator 60.

In a case that the ΔΣ-modulator 60 is designed in discrete time, an S/H circuit (not shown) is coupled to the first input summer 611. The S/H circuit transforms the first stage input $U_1$ from continuous time to discrete time.

In a case that the ΔΣ-modulator 60 is designed in continuous time, a first S/H circuit is coupled in between the second inner summer 613c and the first quantizer 613d, and a second S/H circuit is coupled in between the second loop filter 632 and the second quantizer 633. The first S/H circuit is configured to transform the second inner summation signal $V_{1h}$ from continuous time into discrete time, and the second S/H circuit is configured to transform the second sigma signal $V_{2e}$ from continuous time into discrete time.

Figure 9:
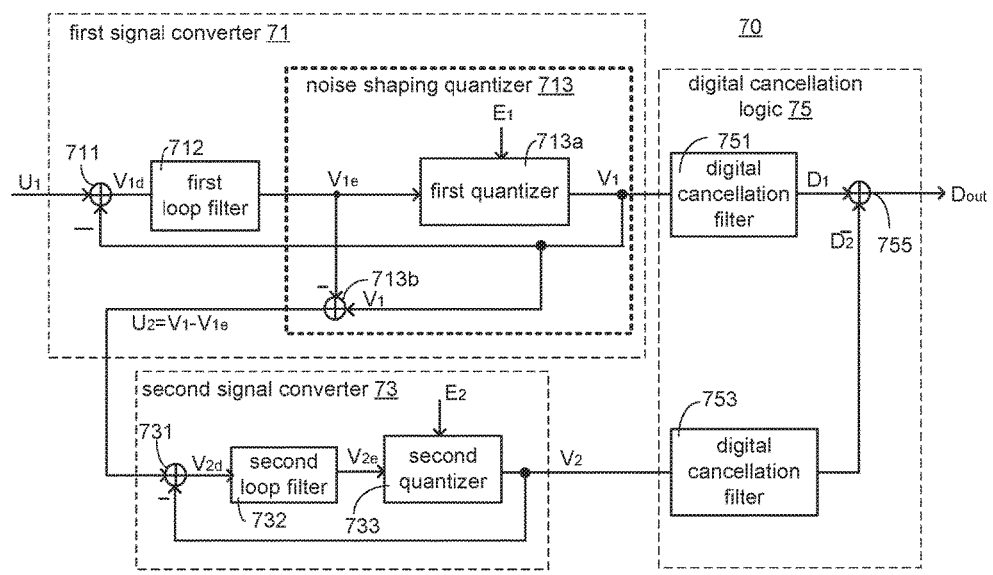
FIG. 9 is a schematic diagram illustrating a $\Delta\Sigma$-modulator according to still another embodiment of the present disclosure.

FIG. 9 is a schematic diagram illustrating a ΔΣ-modulator according to still another embodiment of the present disclosure. The ΔΣ-modulator 70 includes a first signal converter 71, a second signal converter 73 and a digital cancellation logic 75. The first stage quantization error $E_1$ and the second stage quantization error $E_2$ are respectively inherent in quantization operation of the first quantizer 713a and the second quantizer 733. In FIG. 9, the transfer functions of the first quantizer 713a and the second quantizer 733 are assumed to be "1".

The internal connections and functions of the components in the first signal converter 71 are illustrated. The first signal converter 71 includes a first input summer 711, a first loop filter 712, and a noise shaping quantizer 713. The first input summer 711 subtracts the first converted output $V_1$ from the first stage input $U_1$ to generate a first delta signal $V_{1d}$. The first loop filter 712 filters the first delta signal $V_{1d}$ to generate a first sigma signal $V_{1e}$.

The noise shaping quantizer 713 includes a first quantizer 713a and an inner summer 713b. The first quantizer 713a is coupled to the inner summer 713b, the first loop filter 712 and the digital cancellation logic 75. The first quantizer 713a quantizes the first sigma signal $V_{1e}$ received from the first loop filter 712 to generate the first converted output $V_1$.

The linear model of the first quantizer 713a can be represented by equation (21). Equation (21) shows that the first converted output $V_1$ is dependent on the first sigma signal $V_{1e}$, the first stage quantization error $E_1$, and the noise shaping transfer function $NTF_x$.

$$V_1 = V_{1e} + E_1 \cdot NTF_x \qquad \text{equation (21)}$$

The inner summer 713b is coupled to the first quantizer 713a, the digital cancellation logic 75, and the second signal converter 73. While the first quantizer 713a is quantizing the first sigma signal $V_{1e}$, the inner summer 713b is subtracting the first sigma signal $V_{1e}$ from the first converted output $V_1$ to generate the second stage input $U_2$.

Being outputted by the inner summer 713b, the second stage input $U_2$ can be defined by equation (22). As shown in equation (22), the first stage quantization error $E_1$ is shaped by the noise shaping function $NTF_x$ to generate the second stage input $U_2$.

$$\begin{aligned} U_2 &= V_1 - V_{1e} \\ &= (V_{1e} + E_1 \cdot NTF_x) - V_{1e} \\ &= NTF_x \cdot E_1 \end{aligned} \qquad \text{equation (22)}$$

The second signal converter 73 further includes a second input summer 731, a second loop filter 732 and a second quantizer 733. The internal components, operation of the second signal converter 73 are similar to the second signal converters 43, 53 in FIGS. 4 and 6, and details of the second signal converter 73 are omitted here for brevity.

The digital cancellation logic 75 further includes two digital cancellation filters 751, 753, and an output summer 755. The operation of the digital cancellation logic 75 is similar to the digital cancellation logic 45 in FIGS. 4 and 6. Therefore, details of the digital cancellation logic 75 are omitted here for brevity.

As illustrated above, the $\Delta\Sigma$-modulator 70 can be implemented under the scenario of continuous time implementation and/or the scenario of discrete time implementation. Depending on scenarios of implementation type, at least one S/H circuit is inserted in different positions of the $\Delta\Sigma$-modulator 60.

In a case that the $\Delta\Sigma$-modulator 70 is designed in discrete time, an S/H circuit (not shown) is coupled to the first input summer 711. The S/H circuit transforms the first stage input $U_1$ from continuous time to discrete time.

In a case that the $\Delta\Sigma$-modulator 70 is designed in continuous time, a first S/H circuit is coupled in between the first loop filter 712 and the first quantizer 713a, and a second S/H circuit is coupled in between the second loop filter 732 and the second quantizer 733. The first S/H circuit is configured to transform the first sigma signal $V_{1e}$ from continuous time into discrete time, and the second S/H circuit is configured to transform the second sign is signal $V_{2e}$ from continuous time into discrete time.

Figure 10:
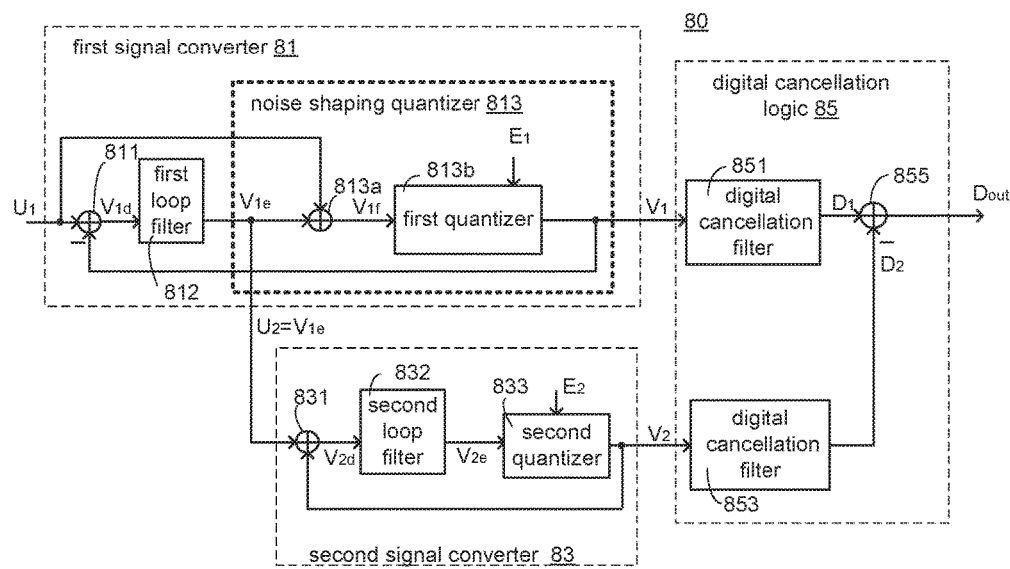
FIG. 10 is a schematic diagram illustrating a $\Delta\Sigma$-modulator according to yet another embodiment of the present disclosure.

FIG. 10 is a schematic diagram illustrating a $\Delta\Sigma$-modulator according to yet another embodiment of the present disclosure. The $\Delta\Sigma$-modulator 80 includes a first signal converter 81, a second signal converter 83 and a digital cancellation logic 85. The first stage quantization error $E_1$ and the second stage quantization error $E_2$ are respectively inherent in quantization operation of the first quantizer 813b and the second quantizer 833. In FIG. 8, the transfer functions of the first quantizer 813b and the second quantizer 833 are assumed to be "1".

The internal connections and functions of the components in the first signal converter 81 are illustrated. The first signal converter 81 includes a first input summer 811, a first loop filter 812 and a noise shaping quantizer 813. The noise shaping quantizer 813 includes an inner summer 813a and a first quantizer 813b.

In FIG. 10, the first stage noise transfer function $NTF_{stage1}$ can be represented by the transfer function of the first loop filter 812 ($H_1$), see equation (23).

$$NTF_{stage1} = \frac{1}{(1+H_1)} \qquad \text{equation (23)}$$

In the first signal converter 81, the first converted output $V_1$ is equivalent to $U_1 + NTF_{stage1} \cdot NTF_x \cdot E_1$. Therefore, based on equation (23), the first converted output $V_1$ can be represented as equation (24).

$$V_1 = U_1 + \frac{1}{(1+H_1)} \cdot NTF_x \cdot E_1 \qquad \text{equation (24)}$$

The first input summer 811 subtracts the first converted output $V_1$ from the first stage input $U_1$ to generate a first delta signal $V_{1d}$. Based on equation (24), the first delta signal $V_{1d}$ can be represented by equation (25).

$$\begin{aligned} V_{1d} &= U_1 - V_1 \\ &= U_1 - \left( U_1 + \frac{1}{(1+H_1)} \cdot NTF_x \cdot E \right) \\ &= -\frac{1}{(1+H_1)} \cdot NTF_x \cdot E_1 \end{aligned} \qquad \text{equation (25)}$$

The first loop filter 812 filters the first delta signal $V_{1d}$ with its transfer function $H_1$ to generate the first sigma signal $V_{1e}$. That is, $V_{1e} = V_{1d} \cdot H_1$. The first sigma signal $V_{1e}$ can be represented by equation (26).

$$V_{1e} = (U_1 - V_1) \cdot H_1 = -\frac{H_1}{(1+H_1)} \cdot NTF_x \cdot E_1 \qquad \text{equation (26)}$$

The first sigma signal $V_{1e}$ and the second stage input $U_2$ can be represented as equation (27) if assuming $$H_1 = \frac{z^{-1}}{1-z^{-1}}.$$

$$V_{1e} = U_2 = (U - V_1) \cdot H_1 = z^{-1} NTF_x \cdot E_1 \qquad \text{equation (27)}$$

The noise shaping quantizer 813 receives the first sigma signal $V_{1e}$ from the first loop filter 812, transmits the first converted output $V_1$ to the digital cancellation logic 85, and transmits the second stage input $U_2$ to the second signal converter 83.

The inner summer 813a is coupled to the first input summer 811, the first loop filter 812 and the second signal converter 83. The inner summer 813a sums the first stage input $U_1$ and the first sigma signal $V_{1e}$ to generate an inner summation signal $V_{1f}$.

The first quantizer 813b is coupled to the first input summer 811, the inner summer 813a and the digital cancellation logic 85. The first quantizer 813b quantizes the inner summation signal $V_{1f}$ to generate the first converted output $V_1$. While the first quantizer 813b is quantizing the inner summation signal $V_{1f}$, the inherent first stage quantization error $E_1$ of the first quantizer $E_1$ is shaped by the noise shaping quantizer 813 to generate the second stage input $U_1$.

As shown in FIG. 10, the first sigma signal $V_{1e}$ is selected as the second stage input $U_1$. That is, $U_2=V_{1e}$. Therefore, according to equation (27), the first stage quantization error $E_1$ is shaped by the noise shaping function $NTF_x$ and propagated with an additional delay ($z^{-1}$) to generate the second stage input $U_2$.

The second signal converter 83 includes a second input summer 831, a second loop filter 832 and a second quantizer 833. The internal components, operation of the second signal converter 83 are similar to the second signal converters 43, 53 in FIGS. 4, 6 and details of which are omitted here for brevity.

The digital cancellation logic 85 further includes two digital cancellation filters 851, 853, and an output summer 855. The operation of the digital cancellation logic 85 is similar to that of the digital cancellation logics 45, 55 in FIGS. 4 and 6 and details of which are omitted here for brevity.

As illustrated above, the ΔΣ-modulator 80 can be implemented under the scenario of continuous time and/or the scenario of discrete time. Depending on scenarios of implementation type, at least one S/H circuit is further inserted in different positions of the ΔΣ-modulator 80.

In a case that the ΔΣ-modulator 80 is designed in discrete time, an S/H circuit (not shown) is coupled to the first input summer 811. The S/H circuit transforms the first stage input $U_1$ from continuous time to discrete time.

In a case that the ΔΣ-modulator 80 is designed in continuous time, a first S/H circuit is coupled in between the first inner summer 813a and the first quantizer 813b, and a second S/H circuit is coupled in between the second loop filter 832 and the second quantizer 833. The first S/H circuit is configured to transform the first inner summation signal $V_{1f}$ from continuous time into discrete time, and the second S/H circuit is configured to transform the second sigma signal $V_{2e}$ from continuous time into discrete time.

Both the first signal converters and the second signal converters are assumed to be a ΔΣ-modulator in the embodiments above. However, implementation of the concept of the present disclosure is not limited to these embodiments.

The embodiments shown in FIGS. 3, 9, 10 illustrate that implementations of the noise shaping quantizer may vary, and the second stage input $U_2$ can be generated by variant approaches. Equation (20) shows that, the second stage input $U_2$ in FIG. 8 can be generated by inversing the noise shaped quantization error ($U_2=-NTFx \cdot E_{NTF1}$). Equation (22) shows that, the second stage input $U_2$ in FIG. 9 can be generated by simply noise shaping the first stage quantization error $E_1$ ($U_2=E_{NTF1}$). Equation (27) shows that, the second stage input $U_2$ in FIG. 10 can be generated by delaying the noise shaped quantization error ($U_2=z^{-1} \cdot E_{NTF1}$). In practical applications, generation of the second stage input U2 can be implemented in more ways.

Figure 11:
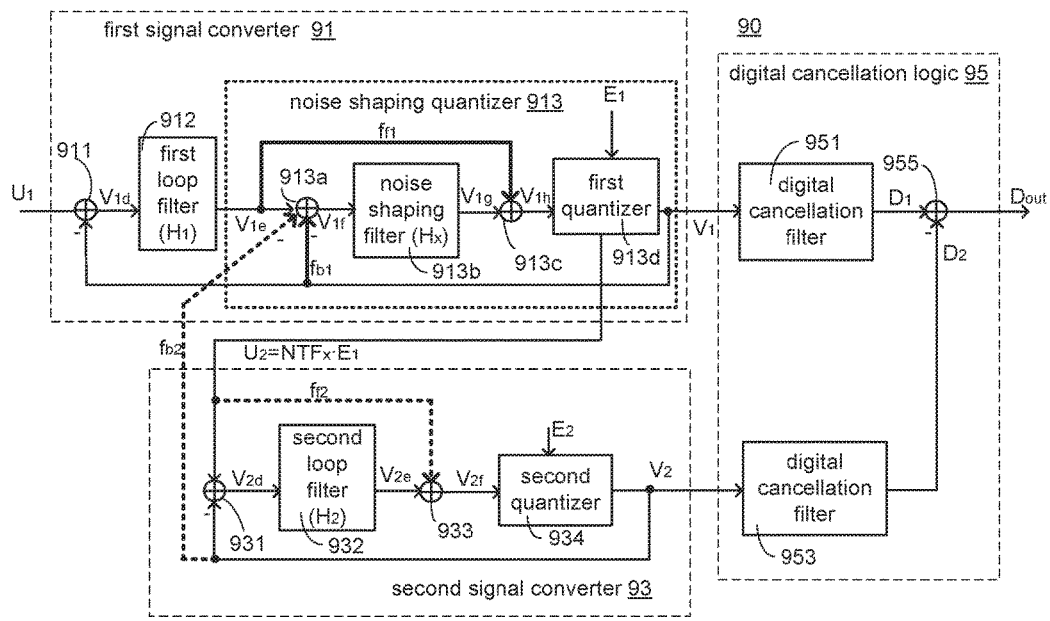
FIG. 11 is a schematic diagram illustrating that design of the digital cancellation logic can be independent of the NS-quantizer

FIG. 11 is a schematic diagram illustrating that design of the digital cancellation logic can be independent of the NS-quantizer. The ΔΣ-modulator 90 includes a first signal converter 91, a second signal converter 93 and a digital cancellation logic 95. The digital cancellation logic 95 includes digital cancellation filters 951, 953, and an output summer 955.

The first signal converter 91 includes a first input summer 911, a first loop filter 912 and a noise shaping quantizer 913. The noise shaping quantizer 913 is arranged for shaping the first stage quantization error $E_1$. The noise shaping quantizer 913 further includes a first inner summer 913a, a second inner summer 913c, a noise shaping filter 913b and a first quantizer 913d. With the noise shaping quantizer 913, the first stage quantization error $E_1$ will be shaped to generate the second stage input $U_2$. The internal connections of the components in the first signal converter 91 are illustrated.

The first input summer 911 subtracts the first converted output $V_1$ from the first stage input $U_1$ to generate a first delta signal $V_{1d}$. After receiving the first delta signal $V_{1d}$, the first loop filter 912 filters the first delta signal $V_{1d}$ to generate a first sigma signal $V_{1e}$.

The first inner summer 913a is coupled to the first input summer 911, the first loop filter 912, the first quantizer 913d, the second quantizer 934 and the digital cancellation logic 95. The first inner summer 913a receives the first sigma signal $V_{1e}$ from the first loop filter 912, the first converted output $V_1$ from the first quantizer 913d, and the second converted output $V_2$ from the second quantizer 934. The first inner summer 913a sums the inversed first sigma signal $V_{1e}$, the first converted output $V_1$ and the inversed second converted output $V_2$ to generate a first inner summation signal $V_{1f}$.

The noise shaping filter 913b is coupled to the first inner summer 913a. After receiving the first inner summation signal $V_{1f}$, the noise shaping filter 913b filters the first inner summation signal $V_{1f}$ to generate a noise shaping signal $V_{1g}$.

The second inner summer 913c is coupled to the first loop filter 912, the first inner summer 913a, the noise shaping filter 913b and the first quantizer 913d. The second inner summer 913c receives the first sigma signal $V_{1e}$ from the first loop filter 912, and receives the noise shaping signal $V_{1g}$ from the noise shaping filter 913b. The second inner summer 913c sums the first sigma signal $V_{1e}$ and the noise shaping signal $V_{1g}$ to generate a second inner summation signal $V_{1h}$.

The first quantizer 913d is coupled to the second inner summer 913c, the second signal converter 93 and the digital cancellation logic 95. After receiving the second inner summation signal $V_{1h}$, the first quantizer 913d quantizes the second inner summation signal $V_{1h}$ to generate the first converted output $V_1$. Meanwhile, the first stage quantization error $E_1$ is shaped and the second stage input $U_2$ is generated accordingly.

The second signal converter 93 further includes a second input summer 931, a loop summer 933, a second loop filter 932 and a second quantizer 934. The internal connections between the components in the second signal converter 93 are illustrated.

The second input summer 931 is coupled to the digital cancellation logic 95 and the first signal converter 91. The second input summer 931 subtracts the second converted output $V_2$ from the second stage input $U_2$ to generate a second delta signal $V_{2d}$.

The second loop filter 932 is coupled to the second input summer 931. The second loop filter 932 filters the second delta signal $V_{2d}$ to generate a second sigma signal $V_{2e}$.

The loop summer 933 is coupled to the second input summer 931 and the second loop first filter 932. The loop summer 933 sums the second sigma signal V2e and the second stage input U2 to generate a loop summation signal V2f.

The second quantizer 934 is coupled to the first signal converter 91, the second input summer 931, the loop summer 933 and the digital cancellation logic 95. The second quantizer 934 quantizes the loop summation signal $V_{2f}$ and generates the second converted output $V_2$.

In FIG. 11, two feed forward paths (that is, a first feed forward path $f_{f1}$ and a second feed forward path $f_{f2}$) and two feedback paths (that is, a first feedback path $f_{b1}$ and a second feedback path $f_{b2}$) are shown.

In the noise shaping quantizer 913, the first feed forward path $f_{f1}$ transmits the first sigma signal $V_{1e}$ to the second inner summer 913c, and the first feedback path $f_{b1}$ transmits the first converted output $V_1$ to the first inner summer 913a. Between the noise shaping quantizer 913 and the second signal converter 93, the second feed forward path $f_{f2}$ transmits the second stage input $U_2$ to the loop summer 933, and the second feedback path $f_{b2}$ transmits the second converted output $V_2$ to the first inner summer 913a.

The first stage noise transfer function $NTF_{stage1}$ of the $\Delta\Sigma$-modulator 90 can be represented by equation (28).

$$NTF_{stage1} = 1/(1 + H_1 + H_x + H_1 \cdot H_x) \qquad \text{equation (28)}$$
$$= 1/(1 + H_1) \cdot (1 + H_x)$$

The signal transfer function STF and the noise transfer function NTF of the $\Delta\Sigma$-modulator 90 can be respectively represented by equations (29) and (30). The first stage noise transfer function $NTF_{stage1}$ in equation (28) can be used for substitution.

$$STF = NTF_{stage2} \qquad \text{equation (29)}$$

$$NTF = NTF_{stage1}(1 + H_x) \qquad \text{equation (30)}$$
$$= (1/(1 + H_1) \cdot (1 + H_x)) \cdot (1 + H_x)$$
$$= 1/(1 + H_1)$$

As mentioned above, the digital cancellation filter 951, 953 are intentionally designed to match the signal transfer function STF and the noise transfer function NTF of the $\Delta\Sigma$-modulator 90. Equations (29) and (30) show that none of the signal transfer function STF and the noise transfer function NTF of the $\Delta\Sigma$-modulator 90 is related to $H_x$. Consequently, the use of the noise shaping filter 913b does not result in changes of the transfer functions of the digital cancellation filter 951, 953.

With the first feed forward path $f_{f1}$ and the second feed forward path $f_{f2}$, the transfer function of the noise shaping filter 913b, "$H_x$", can be independent of design of the digital cancellation filters 951, 953. Therefore, the present disclosure is capable of providing the second stage input $U_2$ without modifying design of the digital cancellation filters 951, 953. In other words, the design complexity of the digital cancellation logic can be simplified.

Reducing side effects caused by mismatch design is not the only advantage of the present disclosure. Furthermore, the use of the noise shaping filter 913b provides the possibilities of reducing design complexity. For example, if the first stage signal transfer function STFstage1 is designed to be a second or upper order system, the proposed MASH structure allows the first signal converter 91 to include two separate filters, that is, a first loop filter and a noise shaping filter. In other words, requirement of designing a higher order design can be transformed into designing two separate and simpler designs. Once the order of the first stage signal transfer function STFstage1 becomes lower, the design of the digital cancellation filters 951, 953 can be simpler. Consequently, the design of the $\Delta\Sigma$-modulator becomes more easily.

The above embodiments demonstrate that by shaping the first stage quantization error $E_1$, the $\Delta\Sigma$-modulator becomes more robust and easier to implement. Alternatively speaking, $\Delta\Sigma$-modulator can tolerate a bigger mismatch between the digital cancellation filters and the analog components. These embodiments are not meant to be a limitation of the present invention.

Figure 12:
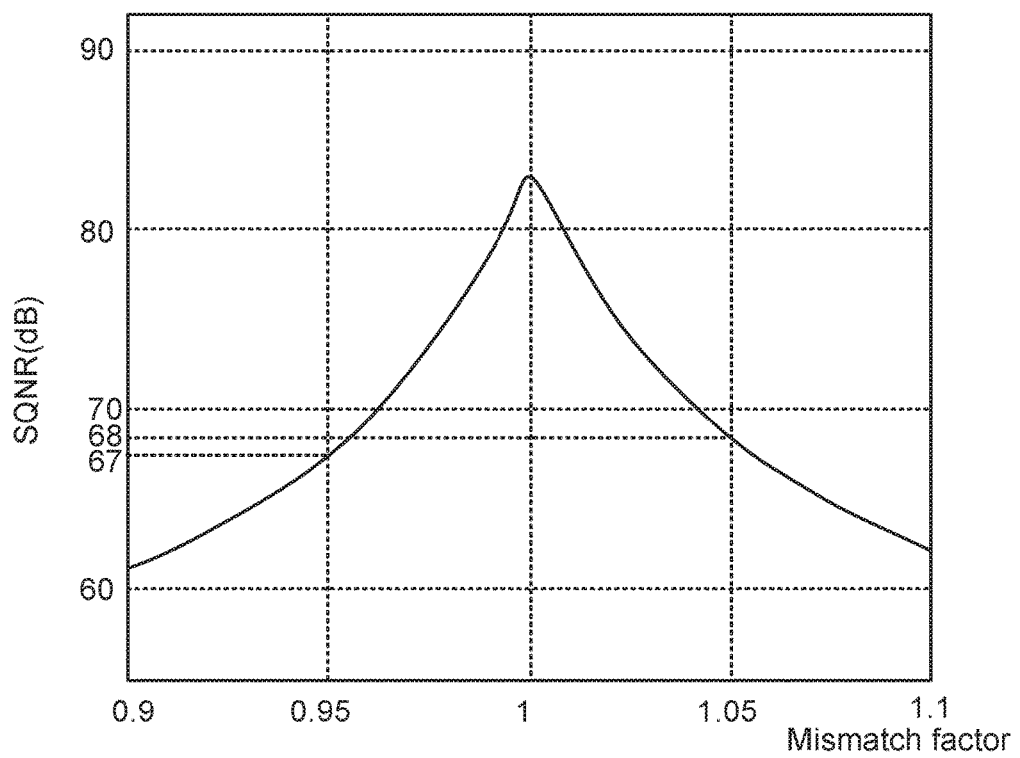
FIG. 12 is a schematic diagram representing the SQNR versus. mismatch factor according to the present disclosure.

FIG. 12 is a schematic diagram representing the SQNR versus mismatch factor according to the present disclosure. Signal-to-quantization-noise ratio (hereinafter, SQNR) is widely used quality measure in analyzing digitizing schemes. A mismatch factor can be selected as a variable to evaluate the robustness to the mismatch of the conventional architecture and proposed one.

The simulation result shown in FIG. 12 is made by assuming the first stage noise transfer function $NTF_{stage1}$ is $1/(1+H_1)$, that is, $NTF_{stage1}=1/(1+H_1)$. When the mismatch factor is equal to 1, the first signal converter with the first stage noise transfer function $NTF_{stage1}$ and the second digital cancellation filter with the circumflex over the first stage noise transfer function $N\hat{T}F_{stage1}$ are perfectly matched. When the mismatch factor is equal to 0.95 or 1.05, there is 5% mismatch between coefficients of the first stage noise transfer function $NTF_{stage1}$ and those of the circumflex over the first stage noise transfer function $N\hat{T}F_{stage1}$.

As the simulation shown in the FIG. 12, the SQNR of the proposed architecture can remain as 67 dB or 68 dB even if the mismatch between the first stage noise transfer function $NTF_{stage1}$ and the circumflex over the first stage noise transfer function $N\hat{T}F_{stage1}$ is equivalent to 5%. The simulation also shows that, according to the concept of the present disclosure, a $\Delta\Sigma$-modulator having 50 MHz signal bandwidth can tolerate around 4% mismatch while maintaining its SQNR over 70 dB.

A typical integrator is used as an example of the loop filter. The z-domain transfer function of the integrator can be expressed as $1/(z-1)$, and the s-domain transfer function of the integrator can be expressed as $1/s$. The mismatch between the digital cancellation filter and the loop filter may occur at a gain value (numerator of the transfer function) and/or a pole value (denominator of the transfer function).

In a case that gain variation exists, the transfer function of the z-domain integrator becomes $(1+a)/(z-1)$. The parameter "a" represents a gain variation caused by process variation. In another case that the pole variation exists, the transfer function of z-domain integrator can be expressed as $1/(z-(1+b))$. That is, the pole of the integrator is located at '1+b' instead of 1.

A simulation is made by assuming both the gain variation and the pole variation, that is, the transfer function is $(1+a)/(z-(1+b))$. According to the simulation results, the SQNR OF the NS-MASH has 6~8 dB improvement with ±10% gain and pole mismatch between the analog loop filters and the digital cancellation filters. Therefore, with the noise shaping function $NTF_x$, the effect caused by the first stage quantization error $E_1$ is mitigated.

Figure 13:
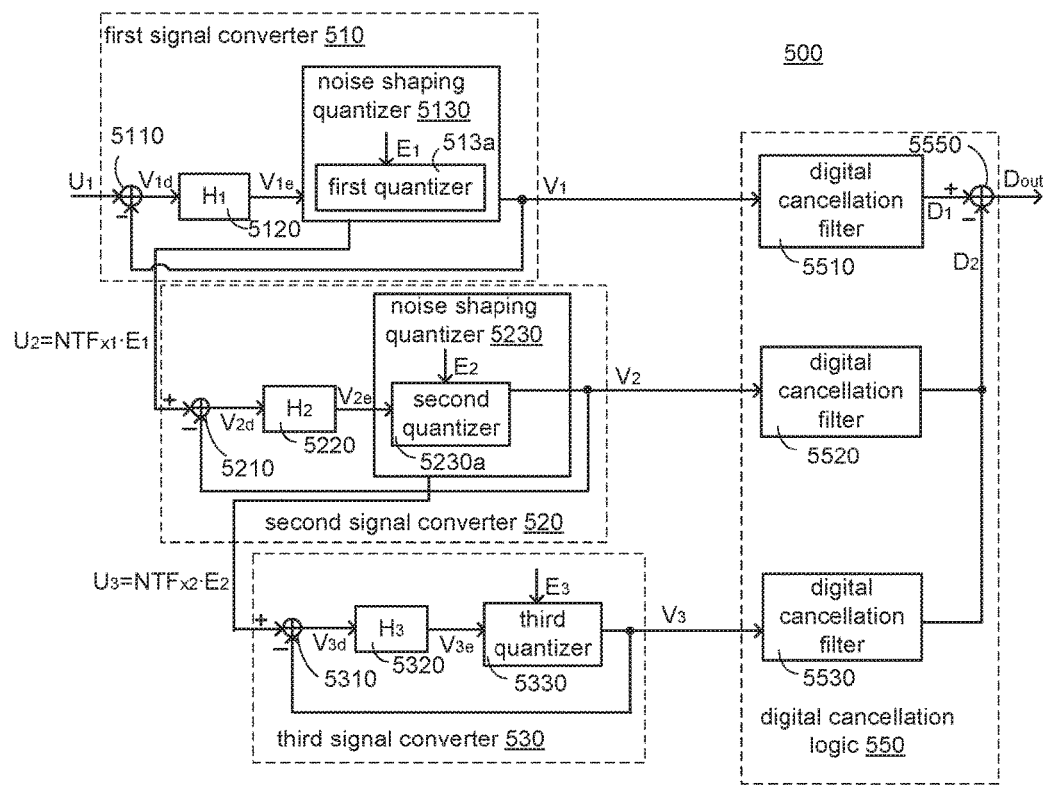
FIG. 13 is a schematic diagram illustrating a three stage MASH-based $\Delta\Sigma$-modulator.

FIG. 13 is a schematic diagram illustrating a three stage MASH-based $\Delta\Sigma$-modulator. The $\Delta\Sigma$-modulator 500 includes a first signal converter 510, a second signal converter 520, a third signal converter 530, and a digital cancellation logic 550.

The operations of the first signal converter 510 and the second signal converter 520 in FIG. 13 are similar to the first signal converters 41, 51 in FIGS. 4, 6 and the operations of the third signal converter 530 in FIG. 13 are similar to the second signal converters 43, 53 in FIGS. 4, 6. The first signal converter 510 converts a first stage input U1 to a first converted output V1, the second signal converter 520 converts a second stage input U2 to a second converted output V2, and the third signal converter 53 converts a third stage input U3 to a third converted output V3.

The first signal converter 510 includes a first input summer 5110, a first loop filter 5120, and a noise shaping quantizer 5130 which are coupled to form a first loop. The first input summer 5110 generates a first delta signal V1d by subtracting the first converted output V1 from the first stage input U1. The first loop filter 5120 filters a first delta signal V1d received from the first input summer 5110 and generates a first sigma signal V1e to the noise shaping quantizer 5130. After receiving the first sigma signal V1e, the noise shaping quantizer 5130 generates the second stage input U2 to the second signal converter 520, and the first converted output V1 to the digital cancellation filter 5530.

The second signal converter 520 includes a second input summer 5210, a second loop filter 5220, and a noise shaping quantizer 5230 which are coupled to form a second loop. The second input summer 521 generates a second delta signal V2d by subtracting the second converted output V2 from the second stage input U2. The second loop filter 5220 filters the second delta signal V2d received from the second input summer 521 and generates a second sigma signal V2e to the noise shaping quantizer 5230. After receiving the second sigma signal V2e, the noise shaping quantizer 5230 generates the third stage input U3 to the third signal converter 530, and the second converted output V2 to the digital cancellation filter 5530.

The third signal converter 530 includes a third input summer 5310, a third loop filter 5320, and a third quantizer which are coupled to form a third loop. The third input summer 5310 generates a third delta signal V3d by subtracting the third converted output V3 from the third stage input U3. The third loop filter 5320 filters the third delta signal V3d from the third input summer 5310 and generates a third sigma signal V3e to the third quantizer 5330 5230 generates the third converted output V3 to the digital cancellation filter 5530.

A first stage quantization error $E_1$, a second stage quantization error $E_2$, and a third quantization error $E_3$ are respectively corresponding to the first quantizer 5130a, the second quantizer 5230a and the third quantizer 5330. The noise shaping quantizer 5130 shapes the first stage quantization error $E_1$ with a first noise shaping transfer function $NTF_{x1}$, and accordingly generates the second stage input $U_2$. The noise shaping quantizer 5230 shapes the second stage quantization error $E_2$ with a second noise shaping transfer function $NTF_{x2}$, and accordingly generates the third stage input $U_3$. Unlike the quantizer in its preceding stages, the third quantizer 5330 does not shape the third quantization error $E_3$.

The digital cancellation logic 550 includes digital cancellation filters 5510, 5520, 5530 and an output summer 5550, and all the digital cancellation filters 5510, 5520, 5530 are coupled to the output summer 5550. The digital cancellation filter 5510 is coupled to the first signal converter 510 to receive the first converted output $V_1$, and the digital cancellation filter 5510 generates a first stage output $D_1$. The digital cancellation filter 5520 is coupled to the second signal converter 520 to receive the second converted output $V_2$, and the digital cancellation filter 5520 generates a second stage output $D_2$. The digital cancellation filter 5530 is coupled to the third signal converter 530 to receive the third converted output $V_3$, and the digital cancellation filter 5530 generates a third stage output $D_3$. The output summer 5550 subtracts the second stage output $D_2$ and the third stage output $D_3$ from the first stage output $D_1$ to generate the digital output $D_{out}$. According to the concept of the present disclosure, the quantization error(s) corresponding to the quantizer(s) preceding the last stage is(are) shaped.

As illustrated above, by shaping a quantization error between different stages, the delta-sigma modulator is capable of reducing the side effects caused by mismatch design. With the NS-based ΔΣ-modulator, the ΔΣ-ADC is well-suited for low-frequency and high accuracy applications.

In the above description, the terms "include" should be interpreted to mean "include, but not limited to . . . ". Moreover, the term "couple" is intended to mean either an indirect or direct electrical connection. Furthermore, implementations of the digital cancellation filters in the digital cancellation logic are not limited. Therefore, the digital cancellation filters may be a finite impulse response (hereinafter, FIR) filter (non-recursive filter) whose output is dependent only on past and present values of its input, or an infinite impulse response (hereinafter, IIR) filter (recursive filter) whose output is dependent on past and present values of both its input and output.

The functional blocks mentioned above can be implemented by including (but is not limited to) using any suitable component discussed herein, along with any suitable software, circuitry, hub, computer code, logic, algorithms, hardware, controller, interface, link, bus, communication pathway, etc. Alternatively, the system may include a memory that comprises machine-readable instructions for performing any of the activities discussed above.

Note that the descriptions above with reference to the figures are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A delta-sigma modulator, for digitizing a first stage input, comprising:
   a first signal converter, comprising:
   a first input summer, for summing a first converted output and the first stage input to generate a first delta signal;
   a first loop filter, coupled to the first input summer, for filtering the first delta signal to generate a first sigma signal;
   a noise shaping quantizer, coupled to the first loop filter, for quantizing the first sigma signal to generate the first converted output, and shaping a first stage quantization error to generate a second stage input, wherein the first stage quantization error is inherent in quantization operation of the noise shaping quantizer, and the first stage input and the second stage input are analog signals;
   a second signal converter, for converting the second stage input to a second converted output; and
   a digital cancellation logic, coupled to the first input summer, the noise shaping quantizer and the second signal converter for generating a digital output according to the first converted output and the second converted output, wherein the noise shaping quantizer comprises:

a first inner summer, coupled to the first loop filter, for summing the first converted output and the first sigma signal to generate a first inner summation signal, wherein the first inner summation signal is used as the second stage input;

a noise shaping filter, coupled to the first inner summer, for filtering the first inner summation signal to generate a noise shaped signal;

a second inner summer, coupled to the first loop filter, the noise shaping filter and the first inner summer, for summing the noise shaped signal and the first sigma signal to generate a second inner summation signal; and a first noise shaping quantizer, coupled to the first inner summer, the second inner summer and the digital cancellation logic, for quantizing the second inner summation signal to generate the first converted output, wherein the first stage quantization error is generated by the first noise shaping quantizer.

2. The delta-sigma modulator according to claim 1, wherein the second signal converter comprises:

a second input summer, coupled to the first signal converter and the digital cancellation logic, for summing the second converted output and the second stage input to generate a second delta signal;

a second loop filter, coupled to the second input summer, for filtering the second delta signal to generate a second sigma signal; and a second noise shaping quantizer, coupled to the second input summer, the second loop filter and the digital cancellation logic, for quantizing the second sigma signal to generate the second converted output, wherein a second stage quantization error is inherent in quantization operation of the second noise shaping quantizer.

3. The delta-sigma modulator according to claim 1, wherein the second signal converter comprises:

a second input summer, coupled to the first signal converter and the digital cancellation logic, for summing the second converted output and the second stage input to generate a second delta signal;

a second loop filter, coupled to the second input summer, for filtering the second delta signal to generate a second sigma signal; and a loop summer, coupled to the first signal converter, the second input summer and the second loop filter, for summing the second sigma signal and the second stage input to generate a loop summation signal; and a second noise shaping quantizer, coupled to the loop summer and the digital cancellation logic, for quantizing the loop summation signal to generate the second converted output, wherein a second stage quantization error is inherent in quantization operation of the second noise shaping quantizer.

4. The delta-sigma modulator according to claim 1, wherein the second signal converter is a pipeline-based analog-to-digital converter, a successive approximation register (hereinafter, SAR), a noise shaped successive approximation register (hereinafter, NS-SAR), or a noise shaped analog-to-digital converter.

5. The delta-sigma modulator according to claim 1, wherein the digital cancellation logic comprises:

a first digital cancellation filter, coupled to the first signal converter, for filtering the first converted output to generate a first stage output;

a second digital cancellation filter, coupled to the second signal converter, for filtering the second converted output to generate a second stage output; and an output summer, coupled to the first digital cancellation filter and the second digital cancellation filter, for summing the first stage output and the second stage output to generate the digital output.

* * * * *